US007829270B2

(12) United States Patent
Nakahira

(10) Patent No.: US 7,829,270 B2
(45) Date of Patent: Nov. 9, 2010

(54) PHOTOSENSITIVE MATERIAL, METHOD OF MANUFACTURING CONDUCTIVE METAL FILM, CONDUCTIVE METAL FILM AND LIGHT-TRANSMITTING FILM SHIELDING ELECTROMAGNETIC WAVE FOR PLASMA DISPLAY PANEL

(75) Inventor: Shinichi Nakahira, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 249 days.

(21) Appl. No.: 11/913,099

(22) PCT Filed: May 26, 2006

(86) PCT No.: PCT/JP2006/311036

§ 371 (c)(1), (2), (4) Date: Oct. 30, 2007

(87) PCT Pub. No.: WO2006/126739

PCT Pub. Date: Nov. 30, 2006

(65) Prior Publication Data

US 2009/0017277 A1 Jan. 15, 2009

(30) Foreign Application Priority Data

May 27, 2005 (JP) ............................ 2005-156146

(51) Int. Cl.

| | |
|---|---|
| ***G03C 1/00*** | (2006.01) |
| ***G03C 1/005*** | (2006.01) |
| ***G03F 7/00*** | (2006.01) |
| ***G03F 7/40*** | (2006.01) |

(52) U.S. Cl. ....................... 430/496; 430/567; 430/620; 430/627; 430/642; 430/331

(58) Field of Classification Search ................. 430/496, 430/567, 620, 627, 642

See application file for complete search history.

(56) References Cited

U.S. PATENT DOCUMENTS

| | | | | |
|---|---|---|---|---|
| 5,457,019 | A * | 10/1995 | Nozawa et al. | 430/551 |
| 5,753,422 | A | 5/1998 | Shibahara et al. | |
| 6,071,678 | A * | 6/2000 | Takeuchi | 430/348 |
| 6,479,230 | B1 | 11/2002 | Morimoto | |
| 6,746,833 | B2 * | 6/2004 | Ii et al. | 430/394 |
| 2001/0015279 | A1 * | 8/2001 | Marutsuka | 174/35 R |
| 2004/0229028 | A1 * | 11/2004 | Sasaki et al. | 428/220 |

FOREIGN PATENT DOCUMENTS

| | | | |
|---|---|---|---|
| CN | 1338660 | A | 3/2002 |
| EP | 1 434 248 | A2 | 6/2004 |
| JP | 42-23746 | B | 11/1967 |
| JP | 43-12862 | B | 5/1968 |
| JP | 05-16281 | A | 1/1993 |
| JP | 5-283889 | A | 10/1993 |
| JP | 5-327274 | A | 12/1993 |
| JP | 10-338848 | A | 12/1998 |
| JP | 11-170420 | A | 6/1999 |
| JP | 11-170421 | A | 6/1999 |
| JP | 2000-149773 | A | 5/2000 |
| JP | 2000149773 | A * | 5/2000 |
| JP | 2000-181004 | A | 6/2000 |
| JP | 2001-67938 | A | 3/2001 |
| JP | 2003-23290 | A | 1/2003 |
| JP | 2003-46293 | A | 2/2003 |
| JP | 2003-77350 | A | 3/2003 |
| JP | 2004-221564 | A | 8/2004 |
| WO | 01-51276 | A2 | 7/2001 |

OTHER PUBLICATIONS

Machine translation of JP 2000-149773 (no date).*

Tao Deng, et al., "Fabrication of Metallic Microstructures Using Exposed, Developed Silver Halide-Based Photographic Film", Analytical Chemistry, vol. 72 No. 4; Feb. 15, 2000; American Chemical Society; pp. 645-651.

Chinese Office Action issued in corresponding Chinese Application No. 200680018602.3, dated May 12, 2010.

* cited by examiner

*Primary Examiner*—Amanda C. Walke
(74) *Attorney, Agent, or Firm*—Sughrue Mion, PLLC

(57) ABSTRACT

A photosensitive material includes a support and an emulsion layer containing a silver salt emulsion, the photosensitive material is capable of forming a conductive metal film by exposing and developing the emulsion layer, wherein the emulsion layer has a swelling rate of 150% or more.

20 Claims, No Drawings

PHOTOSENSITIVE MATERIAL, METHOD OF MANUFACTURING CONDUCTIVE METAL FILM, CONDUCTIVE METAL FILM AND LIGHT-TRANSMITTING FILM SHIELDING ELECTROMAGNETIC WAVE FOR PLASMA DISPLAY PANEL

TECHNICAL FIELD

The invention relates to a photosensitive material that can form a conductive metal film that can shield an electromagnetic wave generated from a front surface of a display such as a CRT (Cathode Ray Tube), a PDP (Plasma Display Panel), a liquid crystal panel, an EL (electroluminescent) panel, a FED (Field Emission Display) or the like, a microwave oven, an electronics device, a printed wiring board or the like and can form a conductive metal film having transparency. Furthermore, the invention relates to a manufacturing method of a conductive metal film, a conductive metal film and a light-transmitting film shielding electromagnetic wave for plasma display panels.

BACKGROUND ART

Recently, with an increase in the use of various kinds of electric facilities and applied electronic facilities, an EMI (Electro-Magnetic Interference) is in a rapid increase. It is pointed out that the EMI causes, in addition to causing malfunction and disturbance of the electric and electronic facilities, health problem to operators of the facilities. Accordingly, in the electronic and electric facilities, it is demanded to suppress the intensity of the electromagnetic wave emission within a standard or restriction.

As a countermeasure against the EMI, the electromagnetic wave has to be shielded. In this connection, it is obvious that the property of metal which does not transmit the electromagnetic wave may well be utilized. For instance, a method of forming a chassis with a metal or a highly conductive material, a method of inserting a metal plate between circuit boards, and a method of covering a cable with a metal foil are adopted. However, in the CRT and PDP, since an operator has to recognize characters displayed on a screen, the transparency in the display is necessary. Accordingly, since, in all of the above-mentioned methods, in many cases, front surfaces of the displays are obscured, these are improper as a method of shielding against electromagnetic wave.

In particular, since the PDP generates a lot of electromagnetic waves in comparison with the CRT, stronger electromagnetic wave shielding capability is necessary. The electromagnetic wave shielding capability can be conveniently expressed with a surface resistance value. While, in the light-transmitting material shielding electromagnetic wave for CRTs, a surface resistance value of substantially 300 Ω/sq or less is demanded, in the light-transmitting material shielding electromagnetic wave for PDPs, 2.5 Ω/sq or less is demanded and, in a commercial plasma TV with a PDP, it is highly necessary to be 1.5 Ω/sq or less, and more desirably such high electrical conductivity as 0.1 Ω/sq or less is demanded.

Furthermore, a demand level of the transparency is substantially 70% or more for the CRTs and 80% or more for the PDPs, and further higher transparency is desired for the PDPs.

In order to overcome the above problems, as shown below, various materials and methods that make use of a metal mesh having an aperture and thereby combine the electromagnetic wave shielding capability and the transparency have been proposed.

(1) Conductive Fiber

For instance, in JP-A-5-327274 (the term “JP-A” as used herein means an “unexamined published Japanese patent application”), a material shielding electromagnetic wave made of a conductive fiber is disclosed. However, there is a disadvantage in that since the shielding material is large in a mesh line width, when it is used to shield a display screen, a screen becomes darker and characters displayed on the screen are difficult to recognize.

(2) Electroless-plating Processed Mesh

A method where an electroless-plating catalyst is printed in a grid pattern by a printing method and then the electroless-plating is applied is disclosed in JP-A-11-170420 and JP-A-5-283889. However, since a line width of the printed catalyst is such large as substantially 60 μm, the method is not suitable for use in a display that requires a relatively small line width and a dense pattern.

Furthermore, a method where a photoresist containing an electroless-plating catalyst is coated, followed by exposing and developing to form a pattern of the electroless-plating catalyst, further followed by performing electroless-plating is disclosed in JP-A-11-170421. However, the visible light-transmittance of the conductive film, being 72%, is insufficient in the transparency. In addition, since extremely expensive palladium must be used as the electroless plating catalyst, most part of which is removed after the exposure, this method also suffers from a problem of production cost.

(3) Mesh Etched by Use of Photolithography

A method where a thin film metal mesh is formed on a transparent substrate by use of an etching method that makes use of photolithography is disclosed in JP-A-2003-046293, JP-A-2003-023290, JP-A-5-016281 and JP-A-10-338848. Since this method enables to finely process, there are advantages in that a mesh having a high aperture ratio (high transmittance) can be formed and a strong electromagnetic wave emission as well can be shielded. However, this method suffers from problems of a troublesome and complicated production process and thus high production cost. Furthermore, it is known that there is a problem in that, since the etching process is used, the width of the intersectional points in the grid pattern becomes thicker than that of the straight-line portions. Furthermore, the problem of moire is also pointed out; accordingly, an improvement in the problem is demanded.

(4) Method of Forming Conductive Metallic Silver Pattern Using Silver Salt

A photosensitive material that uses a silver salt has been conventionally utilized mainly as a material for recording and transmitting images and pictures. For example, they are commonly used for photographic films such as negative color films, monochrome negative films, films for movies, color reversal films and so on, photographic printing paper such as color paper and monochrome printing paper and so forth, and an emulsion mask (photomask) and so forth utilizing the fact that a metallic silver pattern can be formed as an exposure pattern. In all of these, an image per se obtained by exposing and developing a silver salt has a value, and the image itself is utilized.

However, because developed silver obtained from a silver salt is metallic silver, it is considered that the electric conductivity of the metallic silver may be utilized depending on the production method. Several proposals utilizing such a principle have been known from old days, and examples of disclosing specific methods of forming a conductive silver thin film include the followings. In the 1960s, a method of forming a metallic silver thin film pattern by use of a silver salt diffusion transfer process, in which silver is deposited on physical development nuclei, was disclosed in JP-B-42-023746 (the term "JP-B" as used herein means an "examined Japanese patent application"). It is also disclosed in JP-B-43-012862 that a uniform silver thin film prepared by utilizing a similar silver salt diffusion transfer process and not showing light transmission has a function of attenuating microwaves. Furthermore, a method of utilizing the above principle as it is to conveniently perform exposing and developing with an instant monochrome slide film and thereby form a conductive pattern is disclosed in "Analytical Chemistry", Vol. 72, 645 (2000) and WO 01/51276. Still furthermore, a method where, based on the principle of silver salt diffusion transfer process, a conductive silver film that can be used for display electrodes of plasma displays is formed is disclosed in JP-A-2000-149773.

In the methods described in the literatures mentioned above, specially prepared physical development nuclei are uniformly provided irrespective of on an exposed portion and on a non-exposed portion. Accordingly, there is a problem in that opaque physical development nuclei remain on an exposed portion where a metallic silver film is not formed, and thereby light transmission is degraded. The aforementioned problem is serious particularly in a case when the metal pattern material is used as a light-transmitting material shielding electromagnetic wave for a display such as a CRT and PDP.

Furthermore, it is also difficult to obtain high electric conductivity by use of those methods, and attempts of obtaining a thick silver film for higher electric conductivity are accompanied by a problem of degradation of the transparency. Accordingly, even when the aforementioned silver salt diffusion transfer process is used as it is, the light-transmitting material shielding electromagnetic wave excellent in the light transmission and electric conductivity and thus suitable for shielding electromagnetic waves from an image display screen of an electronic display facility cannot be obtained.

Still furthermore, when, without using the silver salt diffusion transfer process, the electric conductivity is imparted by using a commercially available usual negative film and by subjecting to development, physical development and plating processes, obtainable conductivity and optical transparency are insufficient for use as a light-transmitting material shielding electromagnetic wave for CRTs or PDPs.

Furthermore, in JP-A-2004-221564, a method of manufacturing a light-transmitting material shielding electromagnetic wave that applies a silver salt photosensitive material is disclosed. In the manufacturing method according to related art described in JP-A-2004-221564, a silver salt-containing layer disposed on a support is exposed and developed, followed by applying a physical development and/or plating process to a developed metallic silver portion to allow carrying conductive metal particle. According to the method, a light-transmitting film shielding electromagnetic wave that has high EMI shield property and optical transparency can be obtained.

As mentioned above, when a light-transmitting material shielding electromagnetic wave is formed by use of a silver salt photosensitive material, silver formed by developing (developed silver) is desirably made smaller in the electric resistance. When the resistance of the developed silver is more lowered, the shielding property of the light-transmitting material shielding electromagnetic wave can be improved and thereby its utility value can be heightened. Furthermore, when the physical development and/or plating process is applied to the developed silver like in JP-A-2004-221564, when the electric resistance of the developed silver is made smaller, an improvement in the plating velocity or an improvement in the uniformity can be expected.

In order to further reduce an electric resistance value of the developed silver, it is considered effective to reduce a binder such as gelatin from a silver salt photosensitive material to increase the density of silver halide particles. However, since there is a limit, a technology of further reducing the electric resistance value of the developed silver is in demand.

DISCLOSURE OF THE INVENTION

The invention is carried out in view of such situations, and an objection of the invention is to provide a photosensitive material that can form a conductive metal film of which resistance value is lowered.

Another objection of the invention is to provide a light-transmitting film shielding electromagnetic wave of which electric resistance value is lowered.

That is, the foregoing objects of the invention can be achieved according to configurations below.

(1) A photosensitive material comprising: a support; and an emulsion layer containing a silver salt emulsion, the photosensitive material being capable of forming a conductive metal film by exposing and developing the emulsion layer, wherein the emulsion layer has a swelling rate of 150% or more.

(2) A photosensitive material comprising: a support; and an emulsion layer containing a silver salt emulsion, the photosensitive material being capable of forming a conductive metal film by exposing, developing the emulsion layer, and subjecting the emulsion layer to at least one of a physical development process and a plating process, wherein the emulsion layer has a swelling rate of 150% or more.

(3) The photosensitive material described in the item (1) or (2), wherein the emulsion layer has a weight ratio of silver to gelatin of 4 or more.

(4) The photosensitive material described in the item (1) or (2), wherein the emulsion layer has the weight ratio of silver to gelatin of from 6 to 10.

(5) The photosensitive material described in any one of the items (1) to (4), wherein the emulsion layer has an amount of silver of 5 $g/m^2$ or more.

(6) The photosensitive material described in any one of the items (1) to (5), wherein the emulsion layer has the swelling rate of 250% or more.

(7) The photosensitive material described in any one of the items (1) to (6), wherein the emulsion layer is disposed at a substantially upper-most layer of the photosensitive material.

(8) A method of manufacturing a conductive metal film, comprising: exposing a photosensitive material described in any one of the items (1) to (7) with light; and developing the photosensitive material.

(9) A method of manufacturing a conductive metal film, comprising: exposing a photosensitive material described in any one of the items (1) to (7) with light; developing the photosensitive material; and subjecting the photosensitive material to at least one of a physical development process and a plating process.

(10) The method of manufacturing a conductive metal film described in the item (8) or (9), wherein the exposing is performed by exposing partially the photosensitive material with light to form an exposure pattern including a metallic silver portion, and the exposure pattern corresponds to an electrically conductive metal pattern.

(11) The method of manufacturing a conductive metal film described in the item (10), wherein a metallic silver portion is provided in only a portion of the photosensitive material exposed with the light.

(12) A conductive metal film manufactured according to a method described in any one of the items (8) to (11).

(13) The conductive metal film described in the item (12), comprising: a conductive metal portion; and a portion having light transmissive other than the conductive metal portion.

(14) A light-transmitting film shielding electromagnetic wave for a plasma display comprising an electrically conductive metal film described in the item (13).

According to the invention, when the swelling rate of an emulsion layer is set at 150% or more, a photosensitive material capable of obtaining a conductive metal film of which electric resistance value is reduced can be provided. Furthermore, according to the invention, a light-transmitting film shielding conductive electromagnetic wave high in the electromagnetic wave shielding property and excellent in the plating velocity and the uniformity can be provided.

BEST MODE FOR CARRYING OUT THE INVENTION

In what follows, a photosensitive material according to the invention and a light-transmitting film shielding electromagnetic wave formed with the photosensitive material will be detailed.

1. Photosensitive Material

(Emulsion Layer)

A photosensitive material according to the invention, on a support, has an emulsion layer (silver salt-containing layer) containing a silver salt emulsion as a photosensor. The swelling rate of the emulsion layer is 150% or more. In the invention, the swelling rate is defined as follows.

$$\text{Swelling rate (\%)} = 100 \times ((b) - (a))/(a)$$

In the above formula, (a) expresses a film thickness of the emulsion layer at the time of drying, and (b) expresses a film thickness of the emulsion layer after immersing in distilled water at 25° C. for 1 min.

The film thickness of the emulsion layer (a) can be measured by observing a section of a sample with for instance a scanning electron microscope. The film thickness of the swollen emulsion layer (b) can be measured by observing a section of a sample obtained by freeze drying a swollen sample with liquid nitrogen by means of for instance a scanning electron microscope.

In the invention, the swelling rate of the emulsion layer of the photosensitive material is necessary to be 150% or more. However, a preferable range of the swelling rate depends on a ratio of Ag/binder in the emulsion layer. That is, this is because since a binder portion in the film is swellable but silver halide particles do not swell, even when the swelling rate of the binder portion is same, the higher the ratio of Ag/binder is, the lower the swelling rate of the emulsion layer as a whole is. In the invention, a preferable swelling rate of the emulsion layer is 250% or more when the ratio of Ag/binder of the emulsion layer is 4.5 or more, 200% or more when the ratio of Ag/binder of the emulsion layer is more than 4.5 and less than 6, and 150% or more when the ratio of Ag/binder of the emulsion layer is more than 6. When the range of the ratio of Ag/binder is in the most preferable range of the ratio of Ag/binder of 6 to 10, the swelling rate of the emulsion layer is preferably 150% or more and more preferably 180% or more.

In the invention, there is no upper limit in the swelling rate. However, when the swelling rate is too high, the film strength during the process is lowered, resulting in causing a problem in that the film becomes likely to be damaged. Accordingly, the swelling rate is preferably 350% or less. The swelling rate of the emulsion layer can be controlled through an amount of an added hardener, the pH of the emulsion layer after coating and a content of water.

In the emulsion layer, other than the silver salt emulsion, as needs arise, a dye, a binder, a solvent and so on can be contained. In what follows, the respective components contained in the emulsion layer will be described.

(Silver Salt Emulsion)

As a silver salt emulsion used in the invention, an inorganic silver salt such as silver halide or the like and an organic silver salt such as silver acetate or the like can be cited. In the silver salt emulsion, silver halide excellent in the characteristics as a photosensor is preferably used. Technologies that are used in silver salt photographic films, photographic printing papers, printing plate-making films, emulsion masks for photomasks and so on of the silver halide can be used as well in the invention.

A halogen element contained in the silver halide may be any one of chlorine, bromine, iodine and fluorine, or a combination thereof can be used as well. For instance, silver halide mainly made of AgCl, AgBr and AgI is preferably used, and furthermore, silver halide mainly made of AgBr and AgCl can be preferably used. Silver chlorobromide, silver iodochlorobromide and silver iodobromide as well can be preferably used. Silver chlorobromide, silver bromide, silver iodochlorobromide and silver iodobromide can be more preferably used and silver chlorobromide and silver iodobromide containing 50% or more of silver chloride are most preferably used.

Here, the "silver halide mainly made of AgBr (silver bromide)" means silver halide in which a molar fraction of a bromide ion in a silver halide composition is 50% or more. The silver halide particles mainly made of the AgBr may contain, other than the bromide ion, an iodide ion or a chloride ion.

A content of silver iodide in a silver halide emulsion is preferably 1.5 mole percent based on one mole of silver halide emulsion. When the content of silver iodide is set at 1.5 mole percent, the fog can be inhibited from occurring and the pressure resistance can be improved. The content of silver iodide is more preferably 1 mole percent or less based on 1 mole of the silver halide emulsion.

Silver halide is made of solid particles. From a viewpoint of the image quality of a pattern-like metallic silver layer formed after exposure and development processes, an average particle size of the silver halide is preferably in the range of 0.1 to 1000 nm (1 μm) in terms of a sphere-equivalent diameter, more preferably in the range of 0.1 to 100 nm and still more preferably in the range of 1 to 50 nm.

The sphere-equivalent diameter of the silver halide particle is a diameter of a spherical particle having a volume same as that of the particle.

A shape of the silver halide particle, without restricting to particular one, may be any one of various ones such as a sphere, a cube, a plane table (hexagonal plane table, triangular plane table, square plane table or the like), an octahedron, a tetradecahedron and so on. In addition, it is preferable that the shape of the silver halide particle is the cube and the tetradecahedron.

An inner portion and a superficial layer of the silver halide particle may be made of a uniform phase or different phases.

Furthermore, inside or on a surface of the particle, a layer different in the halogen composition may be localized.

A silver halide emulsion can be prepared according to a method described in P. Glafkides, *Chimie etPhysique Photographique* (Paul Montel, 1967), G. F. Dufin, *Photographic Emulsion Chemistry* (The Forcal Press, 1966), V. L. Zelikman et al, *Making and Coating Photographic Emulsion* (The Forcal Press, 1964) or the like.

That is, as a method of preparing a silver halide emulsion, any of an acidic method and a neutral method may be used, and furthermore, as a method of reacting a soluble silver salt and a soluble halogen salt, any one of one side mixing method, a simultaneous mixing method and a combination thereof may be used.

Furthermore, as a method of forming silver particles, a method where particles are grown in excess of a silver ion (so-called inverted mixing method) can be used as well. Still furthermore, as one system of the simultaneous mixing method, a method where the pAg in a solution where silver halide is formed is maintained constant, that is, a controlled double jet method can be used as well.

Furthermore, a so-called silver halide solvent such as ammonia, thioether, tetra-substituted thiourea or the like can be preferably used to form particles. As such method, a tetra-substituted thiourea compound is more preferable. The tetra-substituted thiourea compounds are described in JP-A-53-82408 and JP-A-55-77737. As the preferable thiourea compound, tetramethyl thiourea and 1,3-dimethyl-2-imidazolidine thion can be cited. An amount of silver halide solvent added, though different depending on a kind of a compound used, a target particle size and a halogen composition, is preferably in the range of $10^{-5}$ to $10^{-2}$ mole per one mole of silver halide.

According to the method of forming particles, which uses the controlled double jet method and a silver halide solvent, a silver halide emulsion that is regular in a crystal type and narrow in a particle size distribution can be readily formed. Accordingly, the method can be preferably used in the invention.

Furthermore, in order to homogenize the particle size, a method where addition speeds of silver nitrate and alkali halide are varied corresponding to a particle growth speed as described in U. K. Patent No. 1,535,016, JP-B-48-36890 and JP-B-52-16364 or a method where a concentration of an aqueous solution is varied as described in U. K. Patent No. 4,242,445 and JP-A-55-158124 can be preferably adopted to grow silver speedily in the range that does not exceed a critical saturation degree.

The silver halide emulsion is preferable to be a monodispersed emulsion and a variation coefficient expressed by {(standard deviation of particle size)/(average particle size)}×100 is preferably 20% and under, more preferably 15% and under, and most preferably 10% and under.

Furthermore, in the silver halide emulsion, a plurality of kinds of silver halide emulsions different in the particle size may be mixed.

The silver halide emulsion may contain metals belonging to VIII group and VIIB group. In particular, in order to achieve high contrast and low fog, a rhodium compound, an iridium compound, a ruthenium compound, an iron compound, an osmium compound and so on can be preferably contained. The compounds may be compounds having various kinds of ligands. As the ligand, for instance, other than pseudo-halogens such as a cyanide ion, a halogen ion, a thiocyanate ion, a nitrosyl ion, water, a hydroxide ion and ammonia, organic molecules such as amines (methyl amine, ethylene diamine and so on), heterocyclic compounds (imidazole, thiazole, 5-methyl thiazole, mercapto imidazole and so on), urea, thiourea and so on can be cited.

Furthermore, in order to obtain higher sensitivity, a hexacyanated metal complex such as $K_4[Fe(CN)_6]$, $K_4[Ru(CN)_6]$ or $K_3[Cr(CN)_6]$ can be advantageously doped.

As the rhodium compound, an aqueous rhodium compound can be used. As the aqueous rhodium compound, for instance, a rhodium (III) halide compound, a hexachloro rhodium (III) complex salt, a pentachloroaqua rhodium complex salt, a tetrachlorodiaqua rhodium complex salt, a hexabromo rhodium (III) complex salt, ahexamine rhodium (III) complex salt, a trioxalate rhodium (III) complex salt, $K_3Rh_2Br_9$ and so on can be cited.

The above-described rhodium compound is generally dissolved in water or an appropriate solvent to use, and a method generally used for stabilizing a solution of the rhodium compound, namely, a method of adding an aqueous solution of hydrogen halide (hydrochloric acid, hydrobromic acid, hydrofluoric acid and so on) or an alkali halide (KCl, NaCl, KBr, NaBr and so on) may be used. It is also possible to add and dissolve separately prepared silver halide particles that are previously doped with rhodium, in place of a water-soluble rhodium compound, at the time of preparation of silver halide.

Examples of the iridium compound include a hexachloro iridium complex salt such as $K_2IrCl_6$, $K_3IrCl_6$ or the like, a hexabromo iridium complex salt, a hexaammine iridium complex salt, a pentachloro nitrosyl iridium complex salt and so on.

Examples of the ruthenium compound include hexachloro ruthenium, pentachloro nitrosyl ruthenium, $K_4[Ru(CN)_6]$ and so on.

Examples of the iron compound include potassium hexacyano ferrate (II) and ferrous thiocyanate.

The ruthenium and osmium can be added in the form of a water-soluble complex salt described in JP-A-63-002042, JP-A-1-285941, JP-A-2-020852 and JP-A-2-020855. Among these, as particularly preferable one, 6-coordinated complexes represented by the following formula can be cited.

$$[ML_6]^{-n}$$

(Here, M Represents Ru or Os, and N Represents 0, 1, 2, 3, or 4.)

In this case, a counter ion is not so important, and for instance an ammonium ion or an alkali metal ion is used. Furthermore, preferable examples of the ligand include a halide ligand, a cyanide ligand, a cyanate ligand, a nitrosyl ligand, a thionitrosyl ligand and so on. Specific examples of the complex for use in the invention are illustrated below, however the ligand is not restricted thereto.

$[RuCl_6]^{-3}$, $[RuCl_4(H_2O)_2]^{-1}$, $[RuCl_5(NO)]^{-2}$, $[RuBr_5(NS)]^{-2}$, $[Ru(CO)_3Cl_3]^{-2}$, $[Ru(CO)Cl_5]^{-2}$, $[Ru(CO)Br_5]^{-2}$, $[OsCl_6]^{3-}$, $[OsCl_5(NO)]^{-2}$, $[Os(NO)(CN)_5]^{-2}$, $[Os(NS)Br_5]^{-2}$, $[Os(CN)_6]^{-4}$ and $[OS(O)_2(CN)_5]^{-4}$.

The addition amount of the compounds is preferably in the range of $1\times10^{-10}$ to $1\times10^{-2}$ mole/mole Ag, and more preferably in the range of $1\times10^{-9}$ to $1\times10^{-3}$ mole/mole Ag.

Other than the above, in the invention, silver halide containing a Pd (II) ion and/or Pd metal can be preferably used. The Pd may be dispersed uniformly in the silver halide particle, however, can be preferably contained in the proximity of a superficial layer of the silver halide particle. Here, the term that the Pd "is contained in the proximity of the superficial layer of the silver halide particle" means that, within 50 nm or less in a depth direction of the silver halide particle from a surface thereof, a layer higher in a palladium content than other layer is present.

Such silver halide particles can be prepared when Pd is added in the middle of forming silver halide particles. After the silver ion and the halogen ion, respectively, are added 50% or more of total addition amounts, the Pd can be preferably added. Furthermore, according to a method where a Pd (II) ion is added at the after ripening, the Pd can be preferably placed on a superficial layer of the silver halide particle.

The Pd-containing silver halide particles can improve the velocities of physical phenomenon and the electroless plating to improve the production efficiency of a desired material shielding electromagnetic wave, and thereby can contribute to lower the production cost. The Pd is well known and used as a catalyst in the electroless plating. However, in the invention, since the Pd can be localized on a superficial layer of a silver halide particle, very expensive Pd can be saved.

A content of a Pd ion and/or Pd metal contained in silver halide is preferably in the range of $1\times10^{-4}$ to 0.5 mole/mole Ag, and more preferably in the range of 0.01 to 0.3 mole/mole Ag.

As examples of a Pd compound used, $PdCl_4$, $Na_2PdCl_4$ and so on can be cited.

In the invention, in order to further improve the sensitivity as a photo-sensor, the chemical sensitization applied in a photographic emulsion can be applied as well. In the chemical sensitization, a method such as chalcogen sensitization such as sulfur sensitization, selenium sensitization, tellurium sensitization or the like, noble metal sensitization such as gold sensitization or the like, reduction sensitization or the like can be used. These may be used singularly or in a combination thereof. When methods of the chemical sensitizations are used in combination, for instance, a combination of sulfur sensitization and gold sensitization; a combination of sulfur sensitization, selenium sensitization and gold sensitization, and a combination of sulfur sensitization, tellurium sensitization and gold sensitization can be preferably used.

The sulfur sensitization is usually performed by adding a sulfur sensitizer and stirring the emulsion at a high temperature of 40° C. or higher for a predetermined time. As the sulfur sensitizer, a known compound can be used. For instance, other than sulfur compounds contained in gelatin, various sulfur compounds such as thiosulfates, thioureas, thiazoles, rhodanines or the like can be used. Preferred sulfur compounds are a thiosulfate and a thiourea compound. An addition amount of the sulfur sensitizer, though varying depending on various conditions such as the pH, the temperature and the magnitude of silver halide particles at the time of chemical ripening, is preferably in the range of $10^{-7}$ to $10^{-2}$ mole, and more preferably in the range of $10^{-5}$ to $10^{-3}$ mole relative to one mole of silver halide.

As the selenium sensitizer for use in the invention, a known selenium compound can be used. That is, in the selenium sensitization, generally, a labile and/or non-labile selenium compound is added, followed by stirring the emulsion at a high temperature of 40° C. or more for a predetermined time. Examples of the labile selenium compound include the compounds described in JP-B-44-015748, JP-B-43-013489, JP-A-4-109240 and JP-A-4-324855. In particular, the compounds represented by formulas (VIII) and (IX) in JP-A-4-324855 can be preferably used.

The tellurium sensitizer for use in the tellurium sensitization is a compound that forms silver telluride that is presumed to form sensitization nuclei on a surface or inside of a silver halide particle. The formation rate of silver telluride in a silver halide emulsion can be examined according to a method described in JP-A-5-313284. Specifically, compounds described in U.S. Pat. Nos. 1,623,499, 3,320,069, and 3,772,031, U. K. Patent Nos. 235,211, 1,121,496, 1,295,462, and 1,396,696, Canadian Patent No. 800,958, JP-A-4-204640, JP-A-4-271341, JP-A-4-333043, and JP-A-5-303157, J. Chem. Soc. Chem. Commun., 635 (1980); ibid., 1102 (1979); ibid., 645 (1979); J. Chem. Soc. Perkin. Trans., 1, 2191 (1980); edited by S. Patai (compiler), The Chemistry of Organic Selenium and Tellurium Compounds, Vol. 1 (1986); and ibid., Vol. 2 (1987) can be used. The compounds represented by formulas (II), (III) and (IV) in JP-A-5-313284 are particularly preferred.

An amount of the selenium sensitizer and tellurium sensitizer used, though varying depending on the silver halide particles used or the chemical ripening conditions, is generally in the range of substantially $10^{-8}$ to $10^{-2}$ mole, preferably in the range of substantially $10^{-7}$ to $10^{-3}$ mole, per mole of silver halide. The conditions of the chemical sensitization are not particularly restricted; however, the pH is in the range of 5 to 8, the pAg is in the range of 6 to 11 and preferably in the range of 7 to 10, and the temperature is in the range of 40 to 95° C. and preferably in the range of 45 to 85° C.

Furthermore, as the noble metal sensitizer, gold, platinum, palladium, iridium and the like can be cited and gold sensitization is particularly preferred. Specific examples of the gold sensitizer for use in the gold sensitization include chloroauric acid, potassium chloroaurate, potassium auric thiocyanate, gold sulfide, gold (I) thioglucose, gold (I) thiomannose and so on can be cited. The gold sensitizer can be used in an amount of substantially $10^{-7}$ to $10^{-2}$ mole per mole of silver halide. In the silver halide emulsion for use in the present invention, a cadmium salt, a sulfite, a lead salt, a thallium salt or the like may be present together in the course of formation or physical ripening of silver halide particles.

Still furthermore, the reduction sensitization may be used to the silver halide emulsion. Examples of the reduction sensitizer include stannous salts, amines, formamidinesulfinic acid, silane compounds and so on. To the silver halide emulsion, a thiosulfonic acid compound may be added according to a method described in European Unexamined Patent Publication (EP) No. 293, 917. As the silver halide emulsion, only one type may be used or two or more types (for example, those different in average particle size, in halogen composition, in crystal habit, in condition of chemical sensitization, or in sensitivity) may be used together. In order to obtain, particularly, high contrast, it is preferable to apply an emulsion with higher sensitivity as the emulsion is closer to a support, as described in JP-A-6-324426.

There is no particular restriction on a coating amount of the silver halide emulsion. When the coating amount of the emulsion is excessive, problems such as rise of cost of the photosensitive material and extension of the developing time are caused. However, as the coating amount of the silver salt emulsion is increased, developed silver having a lower resistance value can be effectively obtained. The coating amount as the silver salt photosensitive material is, in terms of silver, preferably in the range of 2 to 15 $g/m^2$ and more preferably in the range of 4 to 10 $g/m^2$.

(Binder)

In the emulsion layer, in order to uniformly disperse silver salt particles and aid intimate adherence between the emulsion layer and a support, a binder can be used. In the invention, as the binder, all of water-insoluble polymers and water-soluble polymers can be used; however, the water-soluble polymers can be preferably used.

As the binder, for instance, gelatin, polyvinyl alcohol (PVA), polyvinyl pyrrolidone (PVP), polysaccharides such as starch and so on, celluloses and derivatives thereof, polyethylene oxide, polysaccharides, polyvinyl amine, chitosan, polylysine, polyacrylic acid, polyalginic acid, polyhyalulonic acid, carboxy cellulose and so on can be cited. These can have neutral, negative ionicity or positive ionicity depending on the ionicity of a functional group.

A content of the binder contained in the emulsion layer, without restricting to particular one, within the range that can exert the dispersibility and adhesiveness, can be appropriately determined. However, with an increase in a binder ratio in the emulsion layer, developed silver with a lower resistance value can be preferably formed. However, when the ratio of Ag/binder is excessively high, coagulation of the silver halide particles and deterioration of the coating property become problematic. In the invention, the weight ratio of Ag/binder is preferably 3 or more, more preferably 4.5 or more and 12 or less, and most preferably 6 or more and 10 or less.

Furthermore, gelatin is the most preferable binder kind.

(Hardener)

The emulsion layer and other hydrophilic colloidal layers of the photosensitive material involving the invention are preferably hardened with a hardener.

As the hardener, inorganic or organic curing agents can be used singularly or in a combination thereof. For instance, active vinyl compounds (such as 1,3,5-triacryloyl-hexahydro-s-triazine, bis(vinylsulfonyl)methyl ether and N, N'-methylenebis-[β-(vinylsulfonyl)propionamide]), active halogen compounds (such as 2,4-dichlor-6-hydroxy-s-triazine), mucohalogen acids (such as mucochloric acid), N-carbamoyl pyridinium salts (such as (1-molpholy, carbonyl-3-pyridinio) methane sulfonate) and haloamydinium salts (such as 1-(1-chloro-1-pyridinomethylene) pyrrolidinium and 2-naphthalene sulfonate) can be used singularly or in a combination thereof. Among these, active vinyl compounds described in JP-A-53-041220, JP-A-53-057257, JP-A-59-162546 and JP-A-60-080846, and active halogen compounds described in U.S. Pat. No. 3,325,287 are preferable. In what follows, examples of typical compounds of the gelatin curing agent are shown.

H-1

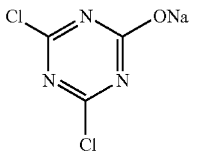

H-2

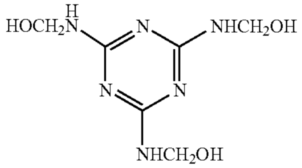

H-3

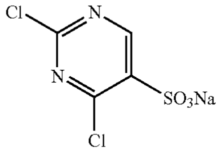

-continued

H-4

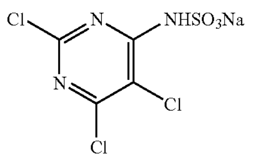

H-5

$CH_2{=}CHSO_2CH_2SO_2CH{=}CH_2$

H-6

$CH_2{=}CHSO_2(CH_2)_2SO_2CH{=}CH_2$

H-7

$CH_2{=}CHSO_2(CH_2)_4SO_2CH{=}CH_2$

H-8

$CH_2{=}CHSO_2CH_2OCH_2SO_2CH{=}CH_2$

H-9

$CH_2{=}CHSO_2(CH_2)_2O(CH_2)_2SO_2CH{=}CH_2$

H-10

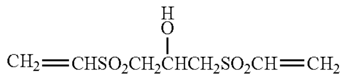

H-11

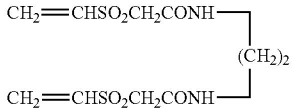

H-12

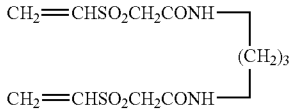

H-13

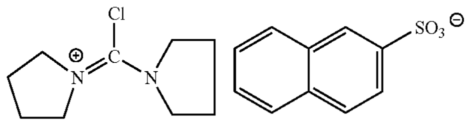

H-14

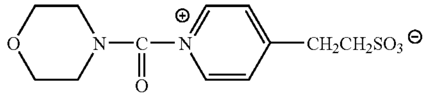

H-15

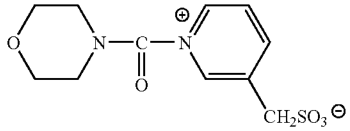

H-16

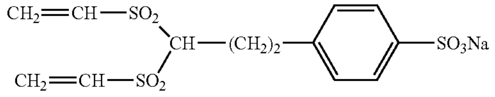

As described above, when an addition amount and so on of the hardener in the emulsion layer are adjusted, the swelling rate of the emulsion layer can be arbitrarily controlled.

A preferable range of an amount of the hardener added to the emulsion layer cannot be uniquely determined because the range is different depending on storage temperature and humidity of the photosensitive material after the hardener is added, the storage duration, the pH of the film of the photosensitive material, an amount of the binder contained in the photosensitive material and so on. In particular, the hardener, before reacting with the binder, can diffuse over an entire layer positioned on the same surface side of the photosensitive material; accordingly, a preferable addition amount of the hardener depends on a total amount of the binder on the same surface side of the photosensitive material including the emulsion layer. The preferable content of the hardener of the photosensitive material of the invention is, relative to a total binder amount on the same surface side of the photosensitive material including the emulsion layer, in the range of 0.2 to 15% by weight and more preferably in the range of 0.5 to 6% by weight.

Furthermore, since the hardener can diffuse as mentioned above, an addition place of the hardener is not necessarily restricted to the emulsion layer. Accordingly, the hardener can be added to any one of layers on the side same as the emulsion layer, or can be divided and added to a plurality of layers.

(Dye)

In the photosensitive material, a dye may be contained at least in the emulsion layer. The dye is contained in the emulsion layer with various intentions such as a filtering dye or irradiation prevention. As the dye, a solid disperse dye may be contained. As the dye preferably used in the invention, dyes represented by general formulas (FA), (FA1), (FA2) and (FA3) described in JP-A-9-179243 can be cited. Specifically, compounds F1 to F34 described in the above publications are preferable. Furthermore, (II-2) to (II-24) described in JP-A-7-152112, (III-5) to (III-18) described in JP-A-7-152112, and (IV-2) to (IV-7) described in JP-A-7-152112 can be preferably used as well.

Other than the above, in dyes that can be used in the invention, as a dye dispersed in solid fine particles to be discolored at the developing or fixing process, a cyanine dye, apyrilium dye, an aminium dye and so on described in JP-A-3-138640 can be cited. Also as a dye not discolored at the processing, a cyanine dye having a carboxyl group described in JP-A-9-096891, a cyanine dye not containing an acidic group described in JP-A-8-245902 and a lake cyanine dye described in JP-A-8-333519, a cyanine dye described in JP-A-1-266536, a holopolar cyanine dye described in JP-A-3-136038, a pyrilium dye described in JP-A-62-299959, a polymer cyanine dye described in JP-A-7-253639, a solid particle dispersion of an oxonol dye described in JP-A-2-282244, light scattering particles described in JP-A-63-131135, a $Yb^{3+}$ compound described in JP-A-9-005913 and an ITO powder described in JP-A-7-113072 can be cited. Furthermore, dyes represented by general formulae (F1) and (F2) described in JP-A-9-179243, more specifically compounds F35 to F112 therein can be used as well.

Still furthermore, a water-soluble dye may be contained as the aforementioned dye. As such water-soluble dye, an oxonol dye, a benzylidene dye, a merocyanine dye, a cyanine dye and an azo dye can be cited. Among these, an oxonol dye, a hemioxonol dye and a benzylidene are useful in the invention. Specific examples of the water-soluble dye that can be used in the invention include those described in British Patent Nos. 584,609 and 1,177,429, JP-A-48-085130, JP-A-49-099620, JP-A-49-114420, JP-A-52-020822, JP-A-59-154439 and JP-A-59-208548, and U.S. Pat. Nos. 2,274,782, 2,533,472, 2,956,879, 3,148,187, 3,177,078, 3,247,127, 3,540,887, 3,575,704, 3,653,905 and 3,718,427.

In the emulsion layer, the dye preferably has a content of 0.01 to 10 mass percent to the total solid content in consideration of an effect of protection against irradiation and a decrease in the sensitivity due to an increase in the content, and more preferably has a content of 0.1 to 5 mass percent.

(Solvent)

As a solvent used to form the emulsion layer, without restricting to particular one, for instance, water, an organic solvent (such as alcohols such as methanol, ketones such as acetone, amides such as formamide, sulfoxides such as dimethyl sulfoxide, esters such as ethyl acetate, and ethers), an ionic liquid and mixtures thereof can be cited.

A content of the solvent used in the emulsion layer according to the invention is, to a total mass of the silver salt, the binder and so on used in the emulsion layer, in the range of 30 to 90 mass percent and more preferably in the range of 50 to 80 mass percent.

(Support)

As a support of the photosensitive material involving the invention, a plastic film, a plastic plate, a glass plate and so on can be used.

As a raw material of the plastic film and the plastic plate, for instance, polyesters such as polyethylene terephthalate (PET), polyethylene naphthalate and so on; polyolefins such as polyethylene (PE), polypropylene (PP), polystyrene, EVA and so on; vinylic resins such as polyvinyl chloride, polyvinylidene chloride and so on; other than the above, polyether ether ketone (PEEK), polysulfone (PSF), polyethersulfone (PES), polycarbonate (PC), polyamide, polyimide, an acrylic resin, triacetyl cellulose (TAC) and so on can be used.

In the invention, the plastic film is preferably a polyethylene terephthalate film in consideration of the transparency, heat resistance, easy handling and cost.

When the conductive metal film obtained according to the invention is used as an electromagnetic shield material for a display, the support is preferable to be a transparent material such as a transparent plastic and so on. In this case, the plastic film or the plastic plate preferably has the transmittance in the entire visible region of 70 to 100%, more preferably 85 to 100% and particularly preferably 90 to 100%.

Furthermore, the support may be colored. In the invention, the support may be employed in a single layer or a multi-layered film that combines two or more layers.

In the case of a glass plate being used as the support, it is not particularly restricted in its type, however, when the conductive metal film obtained according to the invention is used as an electromagnetic shield film for a display, reinforced glass provided with a reinforcement layer on a surface can be preferably used. The reinforced glass is likely to inhibit the glass from being damaged in comparison with non-reinforced glass. Still furthermore, since reinforced glass obtained by an air cooling method gives, even in case of an eventual breakage, small fragments with non-sharp edges, it is preferable from a viewpoint of safety.

(Preparation of Photosensitive Material)

A photosensitive material according to the invention can be formed when an emulsion layer-coating solution containing the above components is coated on a support. Whatever coating methods can be used as a coating method.

In order to achieve the swelling rate, the pH of the emulsion layer after coating is preferably in the range of 3.0 to 9.0 and more preferably in the range of 4.0 to 7.0. The pH of the emulsion layer is defined as a value when a drop of 20 μL of distilled water is dropped on a surface of the emulsion layer and a surface-electrode is brought into contact to read a pH value after 1 min at 25° C. Furthermore, a water content of the emulsion layer is preferably in the range of 50 mass percent or less and more preferably in the range of 5 to 30 mass percent relative to a total binder amount of the emulsion layer.

The photosensitive material according to the invention may have other functional layers other than the emulsion layer. As the other functional layers, for instance, a protective layer, a UL layer, a undercoat layer and so on may be disposed on the emulsion layer side and on a side that does not have the emulsion layer a back layer and so on may be disposed.

The emulsion layer is preferably disposed at the substantially uppermost layer. Here, the term that "the emulsion layer is disposed at the substantially uppermost layer" means not only a case where the emulsion layer is actually disposed at the uppermost layer but also a case where a total film thickness of a layer disposed on the emulsion layer is 0.5 μm or less. A total film thickness of a layer disposed on the emulsion layer is preferably 0.2 μm or less. Furthermore, a film thickness of the emulsion layer, though not particularly restricted, is preferably in the range of 0.2 to 20 μm and more preferably in the range of 0.5 to 5 μm.

2. Conductive Metal Film

With the above-mentioned photosensitive material, a conductive metal film preferable as a light-transmitting film shielding electromagnetic wave can be produced.

In producing an electrically conductive metal film, the emulsion layer of the photosensitive material described above is exposed, followed by developing (including developing, fixing, water washing and so on). Thereby, on a position exposed on the support, developed silver is formed and thereby a conductive metal film can be obtained.

Furthermore, when, after the developing, as needs arise, at least one of physical developing process and plating process are applied, a metallic silver portion is allowed to carry a conductive metal. Thereby, a conductive metal film more improved in the electric conductivity can be obtained. In what follows, the respective steps in the production of the conductive metal film will be described.

(Exposure)

The exposure can be executed with an electromagnetic wave (simply referred to as a "light"). As the electromagnetic wave, for example, light such as visible light, ultraviolet light and so on, and a radiation such as X-ray and so on can be cited. Furthermore, in the exposure, a light source having a wavelength distribution can be used or a light source of a specified wavelength may be used.

As the light source, scanning exposure with, for example, a cathode ray tube (CRT) can be cited. A cathode ray tube exposure system is more convenient, more compact and less expensive in comparison with a system utilizing a laser. Furthermore, adjustments of an optical axis and colors are easy as well. A cathode ray tube employed for image exposure utilizes various kinds of light emitting substances showing a light emission in a necessary spectral region. For instance, a red emitting substance, a green emitting substance and a blue emitting substance are employed either singularly or in a mixture of two or more kinds. The spectral region is not restricted to the aforementioned red, green and blue regions, and a light emitting substance, emitting light in a yellow, orange, purple or infrared region, can be employed as well. In particular, a cathode ray tube emitting a white light by mixing these light emitting substances is frequently used. Furthermore, an ultraviolet lamp is as well advantageously employed, and g-line or i-line of a mercury lamp can be used as well.

In the invention, the exposure can be executed with various laser beams. For instance, in the exposure in the invention, a scanning exposure method that uses monochromatic high-density light of a gas laser, a light-emitting diode, a semiconductor laser, a second harmonic generator (SHG) formed by combining a semiconductor laser or a solid-state laser that uses a semiconductor laser as an excitation light source and a non-linear optical crystal and so on can be preferably used. Furthermore, a KrF excimer laser, an ArF excimer laser, an F2 laser and so on can be used as well. For obtaining a compact and inexpensive system, the exposure is preferably executed with a semiconductor laser or a second harmonic generator (SHG) formed by combining a semiconductor laser or a solid-state laser and a non-linear optical crystal. In particular, for designing a compact, inexpensive, long-life and highly stable system, the exposure is preferably executed by use of a semiconductor laser.

As the laser light source, specifically, a blue semiconductor laser of a wavelength of 430 to 460 nm (published by Nichia Chemical Co. at 48th United Meeting of Applied Physics (March, 2001)); a green light laser of substantially 530 nm which is taken out after the wavelength conversion of a light of a semiconductor laser (oscillation wavelength of substantially 1060 nm) with a $LiNbO_3$ SHG crystal having a waveguide-type inverted domain structure; a red semiconductor laser of a wavelength of substantially 685 nm (type No. HL6738MG, manufactured by Hitachi, Ltd.); a red semiconductor laser of a wavelength of substantially 650 nm (type No. HL6501MG, manufactured by Hitachi, Ltd.) or the like can be preferably used.

A pattern exposure such as a grid pattern exposure can be applied. As a method of carrying out the pattern exposure, a photomask may be used to apply planar exposure, or a laser beam may be used to apply scanning exposure. In this case, refractive exposure employing a lens or reflective exposure with a mirror may be applied, and exposure methods such as a contact exposure, a proximity exposure, a reduction projection exposure, a reflective projection exposure and so on can be applied.

(Developing Process)

The development process can be applied with an ordinary developing technology used in a silver halide photographic film or paper, a lithographic film, an emulsion mask for photomask and so on. A developing solution is not particularly restricted, and a PQ developer, a MQ developer, an MAA developer and so on can be used as well. As a commercially available product, a developing solution or a developing solution in a kit, such as CN-16, CR-56, CP45X, FD-3, or Papitol manufactured by Fuji Photo Film Co., or C-41, E-6, RA-4, D-19 or D-72 manufactured by Eastman Kodak Co can be cited. Also a lithographic developer can be employed.

As the lithographic developer, D85 and so on manufactured by Eastman Kodak Co can be used.

Furthermore, as the developing solution, a developing agent of dihydroxybenzene type can be used. As such dihydroxybenzene developing agent, hydroquinone, chlorohydroquinone, isopropylhydroquinone, methylhydroquinone, a hydroquinonemonosulfonate salt and so on can be cited, among which hydroquinone is particularly preferable. An auxiliary developing agent showing a super additivity with the dihydroxybenzene developing agent includes 1-phenyl-3-pyrrazolidones, p-aminophenols and so on. The developing solution employed in the producing method of the invention preferably employs a combination of a dihydroxybenzene developing agent and 1-phenyl-3-pyrrazolidones or a combination of a dihydroxybenzene developing agent and p-aminophenols.

As a developing agent that can be combined with 1-phenyl-3-pyrrazolidone or a derivative thereof that is used as an auxiliary developing agent, specifically, 1-phenyl-3-pyrrazolidone, 1-phenyl-4,4-dimethyl-3-pyrrazolidone, 1-phenyl-4-methyl-4-hydroxymethyl-3-pyrrazolidone and so on can be cited.

As an auxiliary developing agent of p-aminophenol type, N-methyl-p-aminophenol, p-aminophenol, N-(β-hydroxyethyl)-p-aminophenol, N-(4-hydroxyphenyl)glycine and so on can be cited, among these, N-methyl-p-aminophenol is preferred. The dihydroxybenzene developing agent is usually employed in an amount in the range of 0.05 to 0.8 mole/liter, more preferably employed in an amount of 0.23 mole/liter or more, and still more preferably in an amount in the range of 0.23 to 0.6 mole/liter. Furthermore, in the case of a combination of dihydroxybenzenes and 1-phenyl-3-pyrrazolidones or p-aminophenols being used, it is preferable to employ the former in the range of 0.23 to 0.6 mol/liter and more preferably in the range of 0.23 to 0.5 mol/liter, and the latter in an amount of 0.06 mole/liter or less and more preferably in the range of 0.03 to 0.003 mole/liter.

The developing solution (hereinafter "development starter solution" and "developer replenisher solution" may be collectively referred to as "developing solution") may contain an ordinary additive (such as a preservative or a chelating agent). As such preservative, a sulfite salt such as sodium sulfite, potassium sulfite, lithium sulfite, ammonium sulfite, sodium bisulfite, potassium metabisulfite, sodium formaldehyde bisulfite and so on can be cited. Such a sulfite salt is preferably employed in an amount of 0.20 mole/liter or more and more preferably 0.3 mole/liter or more. However, since when it is used excessively, a silver stain in the developing solution is caused, an upper limit is desirably set at 1.2 mole/L. A particularly preferred range is 0.35 to 0.7 mole/liter.

Furthermore, as the preservative of a dihydroxybenzene developing agent, a small amount of an ascorbic acid derivative may be employed in combination with the sulfite salt. The ascorbic acid derivative includes ascorbic acid, erysorbic acid that is a steric isomer thereof and an alkali metal salt thereof (such as sodium salt or potassium salt). As the ascorbic acid derivative, sodium erysorbate is preferably employed for the material cost. The ascorbic acid derivative is preferably employed in an amount in the range of 0.03 to 0.12 by molar ratio to the dihydroxybenzene developing agent, and particularly preferably in the range of 0.05 to 0.10. In the case of employing the ascorbic acid derivative as the preservative, the developing solution preferably does not include a boron compound.

Other additives employable in the developing solution include a development inhibitor such as sodium bromide and potassium bromide; an organic solvent such as ethylene glycol, diethylene glycol, triethylene glycol and dimethylformamide; a development promoter such as alkanolamine including diethanolamine, triethanolamine and the like, imidazole or a derivative thereof; and a mercapto compound, an indazole compound, a benzotriazole compound and a benzoimidazole compound as an antifoggant or a black pepper spot preventing agent. Specific examples of the benzoimidazole compound include 5-nitroindazole, 5-p-nitrobenzoylaminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenzotriazole, sodium 4-[(2-mercapto-1,3,4-thiadiazol-2-yl)thio]butanesulfonate, 5-amino-1,3,4-thiadiazole-2-thiol, methylbenzotriazole, 5-methylbenzotriazole, 2-mercaptobenzotriazole and the like. Such benzoimidazole compound is ordinarily employed in a content of 0.01 to 10 mmol per 1 liter of the developing solution and more preferably 0.1 to 2 mmol.

Furthermore, the developing solution may further contain an organic or inorganic chelating agent. As the inorganic chelating agent, sodium tetrapolyphosphate, sodium hexametaphosphate and so on can be used. On the other hand, as the organic chelating agent, principally an organic carboxylic acid, an aminopolycarboxylic acid, an organic phosphonic acid, an aminophosphonic acid and an organic phosphonocarboxylic acid can be used.

An addition mount of the chelating agent relative to 1 liter of the developing solution is preferably in the range of $1\times10^{-4}$ to $1\times10^{-1}$ mole and more preferably in the range of $1\times10^{-3}$ to $1\times10^{-2}$ mole.

Furthermore, as the silver stain inhibitor, in the developing solution, compounds described in JP-A-56-024347, JP-B-56-046585 and JP-B-62-002849 and JP-A-4-362942 can be used.

Still furthermore, as the dissolution aid, compounds described in JP-A-61-267759 can be used. Furthermore, the developing solution may contain, as needs arise, a color toner, a surfactant, a deforming agent, a hardener and so on.

A developing temperature and time correlate with each other and are determined in the relationship with a total processing time. In general, a developing temperature is preferably in the range of substantially 20 to 50° C. and more preferably in the range of 25 to 45° C. The developing time is preferably in the range of 5 sec to 2 min and more preferably in the range of 7 sec to 1 min and 30 sec.

The development process in the invention can include a fixing process that is carried out to eliminate the silver salt in an unexposed area and thereby to achieve stabilization. The fixing process can be executed with a fixing technology employed in a silver halide photographic film or paper, a lithographic film, an emulsion mask for photomask or the like.

The fixing solution employed in the fixing step preferably contains following components.

That is, sodium thiosulfate, ammonium thiosulfate, and, as needs arise, tartaric acid, citric acid, gluconic acid, boric acid, iminodiacetic acid, 5-sulfosalicylic acid, glucoheptanoic acid, tiron, ethylenediamine tetraacetic acid, diethylenetriamine pentaacetic acid, nitrilotriacetic acid or a salt thereof can be preferably contained. From the standpoint of recent environmental protection, boric acid is preferably not used. As the fixing agent of the fixing solution used in the invention, sodium thiosulfate, ammonium thiosulfate and so on can be cited, and ammonium thiosulfate is preferred in consideration of the fixing speed. However, sodium thiosulfate may be employed as well from the standpoint of the recent environmental protection. Although an amount of such a known fixing agent can be appropriately varied, it is generally in the range of substantially 0.1 to 2 mole/liter and preferably in the range of 0.2 to 1.5 mole/liter. The fixing solution may contain, as needs arise, a hardening agent (such as a water-soluble aluminum compound), a preservative (such as a sulfite salt, or a bisulfite salt), a pH buffer (such as acetic acid), a pH regulating agent (such as ammonia or sulfuric acid), a chelating agent, a surfactant, a humidifying agent and a fixing promoter.

As the surfactant, an anionic surfactant such as a sulfate compound or a sulfonated compound, a polyethylene-based surfactant, or an amphoteric surfactant described in JP-A-57-006740 can be cited. In the fixing solution, a known defoaming agent may be added.

As the humidifying agent, for instance, alkanolamine, alkylene glycol and so on can be cited. Furthermore, as the fixing promoter, a thiourea derivative described in, for instance, JP-B-45-035754, JP-B-58-122535 and JP-B-58-122536; alcohol having a triple bond in the molecule; a thioether compound described in U.S. Pat. No. 4,126,459; a mesoion compound described in JP-A-4-229860 and so on can be cited. A compound described in JP-A-2-044355 may be used. Still furthermore, as the pH buffer, for instance, an organic acid such as acetic acid, malic acid, succinic acid, tartaric acid, citric acid, oxalic acid, maleic acid, glycolic acid, adipic acid or the like or an inorganic buffer such as boric acid, a phosphate salt, a sulfite salt or the like can be used. The pH buffer is preferably acetic acid, tartaric acid or a sulfite salt. The pH buffer is employed for the purpose of inhibiting the pH from increasing in the fixing solution owing to a carry-over of the developing solution, preferably in an amount of 0.01 to 1.0 mole/liter, and more preferably in an amount of substantially 0.02 to 0.6 mole/liter. The fixing solution preferably has a pH value in the range of 4.0 to 6.5 and particularly preferably in the range of 4.5 to 6.0. Furthermore, as the dye dissolution promoter, a compound described in JP-A-64-004739 may be employed as well.

As the hardening agent in the fixing solution, a water-soluble aluminum salt or chromium salt can be cited. A preferable compound as the hardening agent is a water-soluble aluminum salt and aluminum chloride, aluminum sulfate, potassium alum and so on can be cited. A preferable addition amount of the hardening agent is in the range of 0.01 to 0.2 mole/liter, and more preferably in the range of 0.03 to 0.08 mole/liter.

In the fixing step, a fixing temperature is preferably in the range of substantially 20 to 50° C. and more preferably in the range of 25 to 45° C. Furthermore, a fixing time is preferably in the range of 5 seconds to 1 minute and more preferably in the range of 7 to 50 seconds. A replenishing amount of the fixing solution is preferably 600 $ml/m^2$ or less to the processed amount of the photosensitive material, more preferably 500 $ml/m^2$ or less and particularly preferably 300 $ml/m^2$ or less.

The photosensitive material subjected to the developing and fixing processes is preferably subjected to a rinsing process or a stabilization process. In the rinsing process or the stabilization process, the rinsing is normally executed at a water amount of 20 liters or less per 1 $m^2$ of the photosensitive material and with a replenishing amount of 3 liters or less (including 0, namely rinsing in a standing water bath). Accordingly, not only water saving can be realized but also a piping in an automatic processor can be done without. As a method of reducing the replenishing amount of rinsing water, a multi-step (2- or 3-step) counterflow system has been well known. When such a multi-step counterflow system is employed in the producing method of the invention, the photosensitive material after the fixing step is processed gradually in a proper direction, namely processed while sequentially coming into contact with a processing solution in a direction of the processing solution that is not contaminated with the fixing solution, thereby a more efficient rinsing can be achieved. Furthermore, in the case of the rinsing operation being carried out with a small amount of water, a rinsing tank is preferably provided with a squeeze roller or a crossover roller described in JP-A-63-018350 and JP-A-62-287252. Still furthermore, in order to alleviate a pollution problem that may arise in the rinsing with a small amount of water, various oxidants or a filtration with a filter can be combined. Furthermore, in the above method, an overflowing liquid from a rinsing bath or a stabilizing bath, which is generated when water processed with antimold means is replenished to the rinsing bath or the stabilizing bath in accordance with the process, can be partially or entirely utilized in a processing solution having the fixing ability that is a previous processing step as described in JP-A-60-235133. Still furthermore, a water-soluble surfactant or a defoaming agent may be added in order to inhibit a bubble pattern that tends to be generated in the rising with a small amount of water from occurring and/or a processing component adhering to the squeeze roller from being transferred to the processed film.

Furthermore, in the rinsing process or the stabilization process, a dye adsorbent described in JP-A-63-163456 may be provided to the rinsing bath to inhibit a dye dissolved from the photosensitive material from contaminating. Still furthermore, in the stabilizing process succeeding to the rinsing process, a bath containing a compound described in JP-A-2-201357, JP-A-2-132435, JP-A-1-102553 and JP-A-46-044446 may be employed as a final bath for the photosensitive material. In this case, as needs arise, an ammonium compound, a compound of a metal such as Bi or Al, a fluorescent whitening agent, various kinds of chelating agents, a film pH regulating agent, a hardening agent, an antiseptic, an antimold agent, an alkanolamine or a surfactant may be added. The water employed in the rinsing process or the stabilization process can be tap water, or preferably deionized water or water sterilized with halogen, an ultraviolet sterilizing lamp or various kinds of oxidants (such as ozone, hydrogen peroxide, a perchlorate salt or the like). Furthermore, rinsing water containing a compound described in JP-A-4-039652 and JP-A-5-241309 can be used.

The rinsing process or the stabilization process can preferably employ a bath temperature of 0 to 50° C. and a time of 5 seconds to 2 minutes.

A mass of metallic silver contained in an exposed area after the development process is preferably 50 mass percent or higher with respect to the mass of silver contained in the exposed area prior to the exposure and more preferably 80 mass percent or higher. When the mass of metallic silver contained in an exposed area is 50 mass percent or higher with respect to the mass of silver contained in the exposed area prior to the exposure, high electric conductivity can be obtained.

The gradation after the development process is, though not particularly restricted, preferably higher than 4.0. When the gradation exceeds 4.0 after the development process, the electric conductivity in the conductive metal portion can be heightened while maintaining high transparency in the light transmitting portion. As gradation means for obtaining the gradation of higher than 4.0, for example, doping with rhodium ions or iridium ions as described above can be cited.

(Physical Development and Plating Process)

In order to provide a metallic silver portion formed by the exposure and the development process with the electric conductivity, a physical development and/or a plating process can be applied to cause the metallic silver portion to carry conductive metal particles. When the physical development process and/or the plating process are applied, the conductive metal particles can be carried on the metallic silver portion by either of the physical development or the plating process. However, the physical development process and the plating process can be combined to cause the metallic silver portion to carry conductive metal particles. A metallic silver portion, subjected to the physical development and/or the plating process is called a “conductive metal portion”.

The “physical development” in the invention means to reduce a metal ion such as a silver ion with a reducing agent to precipitate metal particles on nuclei of a metal or a metal compound. Such physical development is utilized in an instant monochrome film, an instant slide film, a lithographic film or the like, and such technology can be utilized in the present invention.

Furthermore, the physical development may be applied simultaneously with the development process after the exposure, or separately after the development process.

In the invention, in the plating process, electroless plating (chemical reduction plating or substitution plating), electrolytic plating or both of the electroless plating and electrolytic plating can be used. In the electroless plating, a known electroless plating technology such as that utilized in, for example, a printed wiring board can be used, and the electroless plating is preferably an electroless copper plating.

Chemical species contained in an electroless copper plating solution include copper sulfate or copper chloride, a reducing agent such as formalin or glyoxylic acid, a copper ligand such as EDTA, triethanolamine or the like, and other additives such as polyethylene glycol, a ferrocyanate salt or bipyridine for bath stabilization and for improving smoothness of a plated film.

An electrolytic copper plating bath can be a copper sulfate bath or a copper pyrophosphate bath.

Furthermore, in the electrolytic plating, a known electrolytic technology can be used. As a plating solution used in the electrolytic plating, in the case of the copper plating, one that contains 30 to 300 g/L of copper sulfate pentahydrate and 30 to 300 g/L of sulfuric acid can be used. In the case of the nickel plating, one that contains nickel sulfate, nickel chloride and so on is used. Furthermore, in the case of silver plating, one that contains silver cyanide and so on can be used. Still furthermore, in the plating solution, additives such as a surfactant, a sulfur compound, a nitrogen compound and so on can be added.

A voltage applied in the electrolytic plating is preferably in the range of 1 to 100 V and more preferably in the range of 2 to 60 V.

The plating speed in the plating process may be mild or rapid such as 5 μm/hr or more. In the plating process, from a viewpoint of improving the stability of the plating solution, various kinds of additives such as a ligand such as EDTA and so on can be used.

The conductive metal portion formed according to the physical phenomena and/or plating carries conductive metal particles and thereby has excellent electric conductivity. The surface resistivity of a conductive metal film provided with a conductive metal portion is preferably 10 Ω/sq or less, more preferably 2.5 Ω/sq or less, still more preferably 1.5 Ω/sq or less and most preferably 0.1 Ω/sq or less.

When the conductive metal film is used as a light-transmitting material shielding electromagnetic wave, a line width of the conductive metal portion is preferably 20 μm or less, more preferably 15 μm or less, still more preferably 10 μm or less and most preferably 7 μm or less. A line separation is preferably 50 μm or more. Furthermore, in order to establish the earth connection or the like, the conductive metal portion may have a portion wider than 20 μm in the line width.

Still furthermore, a portion other than the conductive metal portion has transparency (hereinafter, the portion having the transparency other than the conductive metal portion referred to as an light-transmitting portion). The light transmittance of the light-transmitting portion is preferably 90% or more, more preferably 95% or more, still more preferably 97% or more and most preferably 99% or more. The light transmittance of the light-transmitting portion indicates the transmittance shown as an average value of the transmittance in a wavelength region of 380 to 780 nm, from which a contribution of light absorption and the reflection of the support is excluded, and can be expressed with ((light transmittance of a transparent portion of a light-transmitting material shielding electromagnetic wave)/(light transmittance of a support))×100(%)

(Oxidation Process)

To a metallic silver portion after the development process and a conductive metal portion formed by the physical development and/or the plating process, an oxidation process is preferably applied. When the oxidation process is applied, for instance when a metal is slightly deposited on the light-transmitting portion, the metal can be removed and thereby the transmittance of substantially 100% can be obtained in the light transmitting portion.

As the oxidation process, a known process utilizing various oxidants such as a Fe (III) ion treatment or the like can be cited. As described above, the oxidation process can be applied after the exposure and the development process of the emulsion layer, after the physical development or the plating process, or after the development process and the physical development or the plating process.

In the invention, it is furthermore possible to treat the metallic silver portion after the exposure and the development process, with a Pd-containing solution. Pd can be a divalent palladium ion or metallic Pd. Such treatment can accelerate the electroless plating or the physical development.

(Blackening Process)

In order to heighten the contrast of the conductive metal portion and to inhibit it from fading by an oxidation thereof with time, a surface of the conductive metal portion is preferably blackened. The blackening process can be applied by means of dipping in an electrolytic solution of blackened copper, blackened nickel, blackened tin, blackened nickel-tin, blackened nickel-zinc or the like. Furthermore, a method applied in the field of a printed wiring board, for example a treatment for 2 minutes at 95° C. in an aqueous solution of sodium chlorite (31 g/l), sodium hydroxide (15 g/l) and trisodium phosphate (12 g/l) can be applied.

3. Light-Transmitting Film Shielding Electromagnetic Wave

A conductive metal film according to the invention has high electromagnetic wave-shielding property and light-transmitting property. Accordingly, the conductive metal film, by assembling in a CRT, an EL, a liquid crystal display, a plasma display, other image displaying flat panel, or an imaging semiconductor integrated circuit typical in a CCD, can be used as a film shielding electromagnetic wave. In particular, in the plasma display, the image quality can be maintained or improved without largely damaging the brightness; accordingly, it can be preferably applied.

As applications of the conductive metal film according to the invention, without restricting to the foregoing display devices, a measurement device that radiates an electromagnetic wave, a window for probing the inside of a measurement device or a manufacturing device and chassis thereof, and windows of a building and an automobile that may be subjected to the electromagnetic interference owing to towers and high-voltage cables can be cited.

The conductive metal film, when used as a light-transmitting film shielding electromagnetic wave, can be provided with an adhesive layer. Furthermore, a peelable protective film can be adhered onto the adhesive layer. In what follows, these will be described.

(Adhesive Layer)

An adhesive layer is disposed on a side where the conductive metal film is adhered to other display or the like. On a surface on a side where a metallic silver portion (or conductive metal portion) of the conductive metal film is formed, an adhesive layer may be disposed, or, on a surface opposite to the side where the metallic silver portion is formed, it may be disposed. A thickness of the adhesive layer is set preferably at a thickness of the metallic silver portion (or conductive metal portion) or more, and, can be, for instance, in the range of 10 to 80 μm and more preferably in the range of 20 to 50 μm.

The refractive index of the adhesive in the adhesive layer is preferably in the range of 1.40 to 1.70. When the refractive index is set in the range of 1.40 to 1.70, the difference between the refractive indexes of the support of the conductive metal film and the adhesive can be made smaller and thereby the visible light transmittance can be inhibited from deteriorating.

Furthermore, the adhesive is preferably one that flows under heating or pressure. In particular, the adhesive preferably exhibits the fluidity under heating at a temperature equal to or less than 200° C. or under pressure at or more than 1 $Kgf/cm^2$.

When such adhesive is used, the conductive metal film can be adhered, with the adhesive layer flowing, to a display or a plastic plate that is an adherend. Accordingly, by use of the lamination and the pressure molding, in particular, by use of the pressure molding, even to an adherend having a curved surface or a complicated shape, the adhesive can be readily adhered.

Accordingly, the softening temperature of the adhesive is preferably 200° C. or less. Since, from the applications of the light-transmitting film shielding electromagnetic wave, an environment used therein is normally less than 80° C. Accordingly, the softening temperature of the adhesive layer is preferably 80° C. or more. From the workability, the softening temperature is preferably in the range of 80 to 120° C. The softening temperature is a temperature where the viscosity becomes $10^{12}$ poise or less, and normally, at that temperature, within substantially 1 to 10 sec, the flow is observed.

As the adhesive that flows under the heating or pressure as mentioned above, thermoplastic resins shown below can be cited as typical ones. For instance, natural rubber (refractive index n=1.52), (di)ene polymers such as polyisoprene (n=1.521), poly-1,2-butadiene(n=1.50), polyisobutene (n=1.505 to 1.51), polybutene (n=1.513), poly-2-heptyl-1,3-butadiene (n=1.50), poly-2-t-butyl-1,3-butadiene (n=1.506), poly-1,3-butadiene (n=1.515) and so on, polyethers such as polyoxyethylene (n=1.456), polyoxypropylene (n=1.450), polyvinylethyl ether (n=1.454), polyvinylhexyl ether (n=1.459), polyvinylbutyl ether (n=1.456) and so on, polyesters such as polyvinyl acetate (n=1.467), polyvinyl propionate (n=1.467) and so on, polyurethane (n=1.5 to 1.6), ethyl cellulose (n=1.479), polyvinyl chloride (n=1.54 to 1.55), polyacrylonitrile (n=1.52), polymethacrylonitrile (n=1.52), polysulfone (n=1.633), polysulfide (n=1.6), a phenoxy resin (n=1.5 to 1.6), and poly (metha)acrylate acid ester such as polyethyl acrylate (n=1.469), polybutyl acrylate (n=1.466), poly-2-ethylhexyl acrylate (n=1.463), poly-t-butyl acrylate (n=1.464), poly-3-ethoxypropyl acrylate (n=1.465), polyoxycarbonyl tetra-methylene (n=1.465), polymethyl acrylates (n=1.472 to 1.480), polyisopropyl methacrylate (n=1.473), polydodecyl methacrylate (n=1.474), polytetradecile methacrylate (n=1.475), poly-n-propyl methacrylate (n=1.484), poly-3,3,5-trimethyl cyclohexyl methacrylate (n=1.484), polyethyl methacrylate (n=1.485), poly-2-nitro-2-methylpropyl methacrylate (n=1.487), poly-1,1-diethyl propyl methacrylate (n=1.489), polymethyl methacrylate (n=1.489) and so on can be used. Two or more of the foregoing acrylic polymers may be polymerized or blended to use, as needs arise.

Furthermore, as copolymer resins of an acrylic resin and a resin other than the acrylic resin, epoxy acrylate (n=1.48 to 1.60), urethane acrylates (n=1.5 to 1.6), polyether acrylates (n=1.48 to 1.49), polyester acrylates (n=1.48 to 1.54) and so on can be used as well. In particular, from a viewpoint of the adhesiveness, urethane acrylates, epoxy acrylates and polyether acrylates are excellent. As the epoxy acrylate, (meth) acrylic acid adducts such as 1,6-hexanediol diglycidyl ether, neopentyl glycol diglycidyl ether, allyl alcohol diglycidyl ether, resorcinol diglycidyl ether, adipic acid diglycidyl ether, phthalic acid diglycidyl ether, polyethylene glycol diglycidyl ether, trimethylol propane tridiglycidyl ether, glycerin tridiglycidyl ether, pentaerythritol tetradiglycidyl ether, sorbitol tetradiglycidyl ether and so on can be cited. Polymers having a hydroxyl group in a molecule like epoxy acrylate can effectively improve the adhesiveness. The copolymer resins, as needs arise, can be used in a combination of at least two kinds thereof.

On the other hand, the adhesive polymer having a weight-average molecular weight (measured by use of gel-permeation chromatography based on a calibration curve of reference polystyrene, same hereinafter) of 500 or more is preferably used. When the molecular weight is 500 or less, the coagulation power of an adhesive composition is excessively low; accordingly, the adhesiveness to the adherend may be deteriorated.

In the adhesive, a curing agent (crosslinking agent) can be included. As the curing agent of the adhesive, amines such as triethylene tetramine, xylene diamine, diaminodiphenyl methane and so on, acid anhydrides such as phthalic anhydride, maleic anhydride, dodecyl succinic anhydride, pyromellitic anhydride, benzophenone tetracarbonate anhydride and so on, diaminodiphenyl sulfone, tris(dimethylaminomethyl)phenol, a polyamide resin, dicyandiamide, ethylmethylimidazole and so on can be used. These can be used singularly or in a combination of at least two kinds thereof.

An addition amount of the curing agent is in the range of 0.1 to 50 parts by weight to 100 parts by weight of an adhesive polymer and preferably selected in the range of 1 to 30 parts by weight. When the addition amount is less than 0.1 parts by weight, the curing becomes insufficient and when it exceeds 50 parts by weight the crosslinking occurs excessively to affect adversely on the adhesiveness.

Furthermore, other than the curing agent, as needs arise, the adhesive may contain additives such as a diluent, a plasticizer, an antioxidant, filler, a coloring agent, a UV-absorber, a tackifier and so on.

When an adhesive layer is formed on a conductive metal film, an adhesive layer composition containing the adhesive polymer, curing agent and other additives is coated so as to partially or wholly cover, for instance, a metallic silver portion (or conductive metal portion), followed by drying a solvent, further followed by heating to cure, and thereby an adhesive layer can be formed.

(Protective Film)

A light-transmitting film shielding electromagnetic wave according to the invention may be provided with a peelable protective film. The protective film may be provided on both surfaces or only on one surface (for instance, on a metallic silver portion or a conductive metal portion) of the light-transmitting film shielding electromagnetic wave.

The light-transmitting film shielding electromagnetic wave, as will be mentioned below, in many cases, is further provided with a functional film having advantages of strengthening the outermost surface, imparting the antireflection property, imparting the stain-resistance and so on. Accordingly, when the protective film is disposed on the light-transmitting film shielding electromagnetic wave, the protective film is preferable to be peelable one.

The peeling strength of the protective film is preferably in the range of 5 mN/25 mm width to 5 N/25 mm width and more preferably in the range of 10 mN/25 mm width to 100 mN/25 mm width. When it is less than the lower limit value, since the protective film can be readily peeled, it may be unfavorably peeled owing to an inadvertent contact during handling. On the other hand, when the peeling strength exceeds the upper limit value, a large force is necessary to peel and when the protective film is peeled a mesh-like metal foil may be unfavorably peeled off a transparent base film (or adhesive layer).

As a film that constitutes a protective film, a film of a resin such as a polyolefinic resin such as a polyethylene resin, a polypropylene resin or the like, a polyester resin such as a polyethylene terephthalate resin or the like, a polycarbonate resin, an acrylic resin or the like can be preferably used. Furthermore, an adhering surface of the protective film may be preferably subjected to the corona discharge or layered with an easy-adhesion layer.

(Functional Film)

When the light-transmitting film shielding electromagnetic wave is applied to a display (in particular, plasma display), a functional film having the functionality described below is preferably adhered to impart each of the respective functionalities. The functional film can be adhered through an adhesive or the like to the light-transmitting film shielding electromagnetic wave.

(Anti-Reflection Property and Anti-Glare Property)

The light-transmitting film shielding electromagnetic wave may be preferably provided with any one of the functionalities such as the anti-reflection (AR: anti-reflection) property for suppressing ambient light from reflecting, anti-glare (AG: anti-glare) property for inhibiting a mirror image from superposing and anti-reflection and anti-glare (ARAG) property that combine both of the above characteristics.

Owing to the functionalities, a display screen can be inhibited from becoming difficult to view due to the superposition of a lighting fixture and so on. Furthermore, when the visible light reflectance of a film surface is lowered, not only the superposition is inhibited from occurring but also the contrast or the like can be improved. The visible light reflectance when a functional film having the anti-reflection and anti-glare property is adhered to the light-transmitting film shielding electromagnetic wave is preferably 2% or less, more preferably 1.3% or less and still more preferably 0.8% or less.

The functional film such as mentioned above can be formed when a functional layer having the anti-reflection property and anti-glare property is disposed on an appropriate transparent base material.

The anti-reflection layer can be formed from one in which a thin film of such as a transparent fluoropolymer resin, magnesium fluoride, a silicone resin, or silicon oxide is formed in a single layer at an optical film thickness of for instance a quarter wavelength, or one in which thin films of inorganic compounds such as a metal oxide, fluoride, silicide, nitride, sulfide and so on or organic compounds such as a silicone-based resin, acrylic resin, fluorinated resin and so on, which are different in the refractive index, are layered in multi-layers of at least two layers.

The anti-glare layer can be formed from a layer having a surface state having fine irregularity of substantially 0.1 to 10 μm. Specifically, when ink obtained by dispersing particles of an inorganic compound or an organic compound such as silica, an organic silicon compound, melamine, acryl or the like in a thermosetting or photo-curable resin such as an acrylic resin, a silicone-based resin, a melamine-based resin, a urethane-based resin, an alkyd-based resin, a fluorinated resin or the like is coated and cured, an anti-glare layer can be formed. An average particle diameter of the particles is preferably in the range of substantially 1 to 40 μm.

Furthermore, the anti-glare layer can be formed when the thermosetting resin or the photo-curable resin is coated, followed by pressing a mold having desired gloss value or a surface state against the coated resin.

The haze of the light-transmitting electromagnetic wave shield film when the anti-glare layer is disposed is preferably 0.5% or more and 20% or less and more preferably 1% or more and 10% or less. When the haze is too small, the anti-glare property is insufficient and, when the haze value is too large, the definition of a transmitted image tends to be deteriorated.

(Hard Coat Property)

In order to impart the scratch resistance to a light-transmitting film shielding electromagnetic wave, the functional film preferably has the hard coat property. As the hard coat layer, a thermosetting or photo-curable resin such as an acrylic resin, a silicone-based resin, a melamine-based resin, a urethane-based resin, an alkyd-based resin, a fluorinated resin or the like can be cited. However, both the kind thereof and a forming method thereof are not particularly restricted. A thickness of the hard coat layer is preferably in the range of substantially 1 to 50 μm. When the anti-reflection layer and/or the anti-glare layer are formed on the hard coat layer, a functional film having the scratch resistance, anti-reflection property and/or anti-glare property can be preferably obtained.

The surface hardness of the light-transmitting layer shielding electromagnetic that is imparted with the hard coat property is preferably at least H in the pencil hardness in accordance with JIS (K-5400), more preferably 2H and still more preferably 3H or more.

(Antistatic Property)

In order to inhibit dirt due to electrostatic charging from adhering and electrostatic discharge due to a contact with a human body from occurring, the light-transmitting film shielding electromagnetic wave is preferably imparted with the antistatic property.

As a functional film having the antistatic property, a film having high electric conductivity can be used. For instance, the electric conductivity may well be substantially $10^{11}\Omega/\square$ or less in the surface resistance.

A film high in the electric conductivity can be formed when an antistatic layer is disposed on a transparent base material. As an antistatic agent that is used in the antistatic layer, specifically, Pelestat (trade name, manufactured by Sanyo Chemical Industries, Ltd.), Electro-stripper (trade name, manufactured by Kao Corporation) and so on can be cited. Other than the above, a known transparent conductive film including ITO or a conductive film in which conductive ultra-fine particles including ITO ultra-fine particles or tin oxide ultra-fine particles are dispersed may be used to form an antistatic layer. The conductive ultra-fine particles may be introduced in the hard coat layer, anti-reflection layer, anti-glare layer or the like to impart the antistatic property.

(Anti-stain Property)

When the light-transmitting film shielding electromagnetic wave has the anti-stain property, it is preferable in that a stain such as a fingerprint can be inhibited from remaining and when the stain is generated it can be readily removed.

A functional film having the anti-stain property can be obtained when a compound that has the anti-stain property is imparted for instance on a transparent base material. As a compound having the anti-stain property, a compound that has the non-wettability to water and/or oil may well be used. For instance, a fluorine compound and a silicon compound can be cited. As the fluorine compound, specifically, Optool (trade name, manufactured by Daikin Industries, Ltd.) and so on can be cited and as the silicon compound Takata Quantum (trade name, manufactured by Nippon Oil and Fats Co., Ltd.) and so on can be cited.

(UV Shielding Property)

In order to inhibit a colorant and a transparent base material described below from deteriorating, the UV shielding property is preferably imparted to the light-transmitting film shielding electromagnetic wave. A functional film having the UV shielding property can be formed according to a method where a UV-absorber is contained in the transparent base material itself or a method where a UV-absorbing layer is disposed on the transparent base material.

As the UV-shielding capability necessary for protecting a dye, the transmittance in a UV-region shorter than a wavelength of 380 nm is 20% or less, preferably 10% or less and more preferably 5% or less. A functional film having the UV shielding property can be obtained when a layer containing a UV-absorber or an inorganic compound that reflects or absorbs UV-light is formed on the transparent base material. As the UV-absorber, existing one such as benzotriazole type, benzophenone type or the like can be used. The kind and concentration thereof are determined depending on the dispersibility and solubility to a medium in which the UV-absorber is dissolved or dispersed, an absorbing wavelength and absorption coefficient, a thickness of the medium and so on and not restricted to particular ones.

It is preferable that the functional film having the UV shielding property is less in the visible light absorption, does not so much deteriorate the visible light transmittance and does not exhibit a color such as yellow or the like.

Furthermore, when a layer containing a dye described below is formed on the functional film, the UV shielding layer is desirably present more exterior than the layer.

(Gas Barrier Property)

When the light-transmitting film shielding electromagnetic wave is used under a temperature and humidity environment higher than room temperature and normal humidity, in some cases, a dye described below may be deteriorated owing to moisture, moisture condenses in the adhesive used for adhesion or an adhesion interface to cause fog and an adhesive causes a phase separation under the influence of the moisture to precipitate and cause fog. Accordingly, the light-transmitting film shielding electromagnetic wave preferably has the gas barrier property.

In order to inhibit such dye deterioration and fog from occurring, it is important to inhibit moisture from intruding into a layer containing a dye or an adhesive layer. In this connection, the functional film has the moisture permeability of 10 $g/m^2\cdot day$ or less and preferably of 5 $g/m^2\cdot day$ or less.

(Other Optical Characteristics)

Since the plasma display generates a strong near infrared ray, when the light-transmitting film shielding electromagnetic wave is used particularly in the plasma display, the near infrared shielding property can be preferably imparted.

As a film having the near infrared ray shielding property, the transmittance thereof in a wavelength region of 800 to 1000 nm is preferably 25% or less, more preferably 15% or less and still more preferably 10% or less.

Furthermore, when the light-transmitting film shielding electromagnetic wave is applied to a plasma display, a transmitting color is preferably neutral gray or blue gray. This is because the emission characteristics and the contrast of the plasma display can be maintained or improved and a white color having a color temperature slightly higher than a standard white color is favored in some cases.

Still furthermore, the color plasma display is said insufficient in the color reproducibility. In particular, an emission spectrum that shows a red color has several emission peaks over a wavelength region from substantially 580 to 700 nm and relatively stronger peaks on a relatively shorter wavelength side thereof. Accordingly, there is a problem in that the red emission becomes near orange that is not excellent in the color purity. In this connection, the functional film preferably has a function of selectively lowering an unnecessary emission from a phosphor or a discharge gas, which is a cause of deterioration of the color purity.

The optical characteristics can be controlled by use of a dye. That is, a near infrared absorber is used to shield near infrared ray, a dye selectively absorbing the unnecessary emission is used to reduce the unnecessary emission, and thereby desired optical characteristics can be obtained. Furthermore, a color tone of an optical filter can be appropriated with a dye having an appropriate absorption in the visible region.

As the dye, a general dye stuff or pigment having a desired absorption wavelength in the visible region or a compound known as an infrared absorber can be used. The kind thereof is not particularly restricted. Commercially available organic dyes such as anthraquinone type, phthalocyanine type, methine type, azomethine type, oxazine type, immonium type, azo type, styryl type, cumarine type, porphiline type, dibenzofuranone type, diketopyrrolopyrrole type, rohdamine type, xanthene type, pyromethene type, dithiol type compound, diiminium type compound and so on can be cited.

A panel surface temperature of a plasma display is high and a temperature of the light-transmitting film shielding electromagnetic wave as well goes up when an environmental temperature is high. Accordingly, the dye preferably has the heat resistance to an extent that does not deteriorate at a temperature of substantially 80° C.

Furthermore, depending on the dye, the light resistance is poor. When such dye is used and deteriorated by an emission from the plasma display and UV light and visible light in ambient light to cause a problem, as mentioned above, it is preferable that a UV-absorber is included in the functional film or the functional film is provided with a layer that does not transmit UV light. Thereby, the dye can be inhibited from deteriorating owing to UV light and visible light.

In addition to heat and light, in an environment of humidity or a combination thereof, a situation is same. When the dye is deteriorated, in some cases, the transmission characteristics of the optical filter are altered to cause a change in the color tone or the near infrared shielding capability is deteriorated.

Furthermore, since the dye is dissolved or dispersed in a resin composition for forming a transparent base material or in a composition for forming a coated layer, the dye is preferably high in the solubility or the dispersibility in a solvent.

Still furthermore, a concentration of the dye can be appropriately set from an absorption wavelength and absorption coefficient of the dye, the transmission characteristics and transmittance required for the light-transmitting film shielding electromagnetic wave, a medium in which the dye is dispersed, or a kind and thickness of a coated film.

When the dye is contained in the functional film, the dye may be contained within the transparent base material or a layer containing a dye may be coated on a surface of the base material. Furthermore, at least two kinds of dyes different in absorption wavelength are mixed and may be contained in one layer or at least two layers containing a dye may be formed.

Furthermore, in some cases, the dye, when coming into contact with a metal, may be deteriorated. Accordingly, when such dye is used, the functional film containing the dye is further preferably disposed so that a Layer containing the dye may not come into contact with a metallic silver portion on the light-transmitting film shielding electromagnetic wave or the conductive metal portion.

When the light-transmitting film shielding electromagnetic wave to which the functional film is adhered is mounted to a display, normally, the light-transmitting film shielding electromagnetic wave is mounted with the functional film mounted on an external side and with the adhesive layer mounted on the display side.

In order that the electromagnetic wave shielding capability of the light-transmitting film shielding electromagnetic wave may not be deteriorated, the metallic silver portion or the conductive metal portion is preferably grounded. Accordingly, it is desirable that a conduction portion is formed on the light-transmitting film shielding electromagnetic wave to ground and the conduction portion is brought into contact electrically with the grounding portion of a display body. The conduction portion is desirably disposed along a peripheral boarder of the light-transmitting film shielding electromagnetic wave around the metallic silver portion or the conductive metal portion.

The conduction portion may be formed in a mesh pattern or from, for instance, a complete metal foil that is not patterned. However, from a viewpoint of securing an excellent electric contact with a grounding portion of the display body, a complete metal foil that is not patterned is preferable.

EXAMPLES

In what follows, the invention will be specifically described with examples. However, the invention is not restricted to the examples.

Example 1

Preparation of Emulsion A

First Solution:

| | |
|---|---|
| Water | 750 ml |
| Gelatin | 20 g |
| Sodium chloride | 1.6 g |
| 1,3-dimethylimidazolidine-2-thion | 20 mg |
| Sodium benzene thiosulfonate | 10 mg |
| Citric acid | 0.7 mg |

Second Solution:

| | |
|---|---|
| Water | 300 ml |
| Silver nitrate | 150 g |

Third Solution:

| | |
|---|---|
| Water | 300 ml |
| Sodium chloride | 38 g |
| Potassium bromide | 32 g |
| Potassium hexachloroiridate (III) (0.005% KCl 20% aqueous solution) | 5 ml |
| Ammonium hexachlororhodate (0.001% NaCl 20% aqueous solution) | 7 ml |

A potassium hexachloroiridate (III) (0.005% KCl 20% aqueous solution) and an ammonium hexachlororhodate (0.001% NaCl 20% aqueous solution) that are used in the third solution were prepared by dissolving powders thereof, respectively, in a 20% KCl aqueous solution and a 20% NaCl aqueous solution, followed by heating at 40° C. for 120 min.

To the first solution kept at 38° C. and pH 4.5, amounts equivalent to 90% of the respective second and third solutions were simultaneously added under stirring over 20 min, and thereby nuclei of 0.15 μm were formed. Subsequently, fourth and fifth solutions described below were added over 8 min, followed by further adding amounts of remaining 10% of the second and third solutions over 2 min, and thereby particles were grown up to 0.18 μm. Furthermore, 0.15 g of potassium iodide was added and ripened for 5 min, and thereby a particle growth process came to completion.

Fourth Solution

| | |
|---|---|
| Water | 100 ml |
| Silver nitrate | 50 g |

Fifth Solution

| | |
|---|---|
| Water | 100 ml |
| Sodium chloride | 13 g |
| Potassium bromide | 11 g |
| Potassium ferrocyanide | 5 mg |

Thereafter, according to a standard flocculation method, water washing was carried out. Specifically, a temperature was lowered to 35° C., 3 g of an anionic precipitant-1 described below was added and sulfuric acid was added to lower the pH until silver halide precipitates (the pH was in the range of 3.2±0.2). In the next place, a supernatant solution of substantially 3 L was removed (first water washing). After 3 L of distilled water was further added, sulfuric acid was added until silver halide was precipitated. Once more, 3 L of a supernatant solution was removed (second water washing). A process same as the second water washing was repeated once more (third water washing) and thereby the water washing and desalinating process came to completion. To an emulsion after the water washing and desalinating process, 8 g of gelatin was added, the pH and pAg, respectively, were adjusted to 5.6 and 7.5, 10 mg of sodium benzene thiosulfonate, 3 mg of sodium benzene thiosulfinate, 15 mg of sodium thiosulfate and 10 mg of chloruaric acid were added, followed by applying the chemical sensitization at 55° C. so as to obtain the optimum sensitivity, further followed by adding 100 mg of 1,3,3a, 7-tetraazaindene as a stabilizer and 100 mg of Proxel (trade name, manufactured by ICI Co., Ltd.) as an antiseptic. Finally, an emulsion of cubic silver iodochlorobromide particles containing 70 mole percent of silver chloride and 0.08 mole percent of silver iodide and having an average particle diameter of 0.18 μm and a variation coefficient of 9% was obtained. (Finally, as an emulsion, pH=5.7, pAg=7.5, electric conductivity=60 μS/m, density=$1.28\times10^3$ kg/$m^3$, and viscosity=60 mPa·s were obtained.).

Anionic precipitant - 1

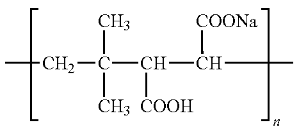

Average molecular weight: 120000

(Preparation of Sample 1-1)

On a polyethylene terephthalate film support described below, of which both surfaces are made of a humidity resistant undercoat layer containing vinylidene chloride, a coating process was applied so as to be a configuration of UL layer/emulsion layer to prepare a sample 1-1. In what follows, methods of preparing the respective layers, coating amounts and coating methods are shown.

(Emulsion Layer)

To the emulsion A, a sensitization dye (sd-1) was added at $5.7\times10^{-4}$ mole/mole Ag to apply the spectral sensitization. Furthermore, KBr and a compound (Cpd-3), respectively, were added at $3.4\times10^{-4}$ mole/mole Ag and $8.0\times10^{-4}$ mole/mole Ag, followed by thoroughly mixing.

In the next place, $1.2\times10^{-4}$ mole/mole Ag of 1,3,3a,7-tetraazaindene, $1.2\times10^{-2}$ mole/mole Ag of hydroquinone, $3.0\times10^{-4}$ mole/mole Ag of citric acid, and surfactants (Sa-1), (Sa-2) and (Sa-3) of which coating amounts, respectively, may be 60, 40, and 2 $mg/m^2$ were added, followed by adjusting the pH of the coating solutions so as to be 5.6 with citric acid. Emulsion layer coating solutions thus prepared were coated on supports described below so as to be Ag 7.6 $g/m^2$ and gelatin 1.1 $g/m^2$.

(L Layer)

| | |
|---|---|
| Gelatin | 0.23 $g/m^2$ |
| Compound (Cpd-7) | 40 $mg/m^2$ |
| Compound (Cpd-14) | 10 $mg/m^2$ |
| Antiseptic (Proxel) | 1.5 $mg/m^2$ |

In the coating solutions of the respective layers, a viscosity improver represented by a structure (Z) below was added to adjust the viscosity.

Viscosity improver Z

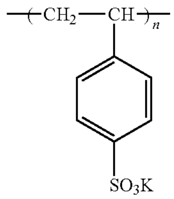

Furthermore, on a sample used in the invention, a back layer and a conductive layer having compositions below were formed.

(Back Layer)

| | |
|---|---|
| Gelatin | 3.3 $g/m^2$ |
| Compound (Cpd-15) | 40 $mg/m^2$ |
| Compound (Cpd-16) | 20 $mg/m^2$ |
| Compound (Cpd-17) | 90 $mg/m^2$ |
| Compound (Cpd-18) | 40 $mg/m^2$ |
| Compound (Cpd-19) | 26 $mg/m^2$ |
| 1,3-divinylsulfonyl-2-propanol | 60 $mg/m^2$ |
| Polymethyl methacrylate fine particles (average particle diameter 6.5 μm) | 30 $mg/m^2$ |
| Fluid paraffin | 78 $mg/m^2$ |
| Compound (Cpd-7) | 120 $mg/m^2$ |
| Calcium nitrate | 20 $mg/m^2$ |
| Antiseptic (Proxel) | 12 $mg/m^2$ |

(Conductive Layer)

| | |
|---|---|
| Gelatin | 0.1 $g/m^2$ |
| Sodium dodecylbenzene sulfonate | 20 $mg/m^2$ |
| $SnO_2$/Sb (9/1 by weight ratio, average particle diameter 0.25 μm) | 200 $mg/m^2$ |
| Antiseptic (Proxel) | 0.3 $mg/m^2$ |

(Sa-1)

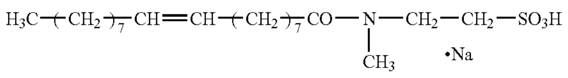

60 $mg/m^2$ (Sa-2)

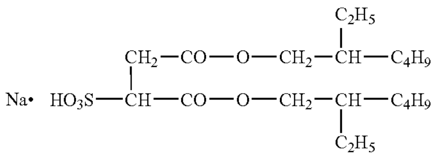

40 $mg/m^2$

-continued
(Sa-3)
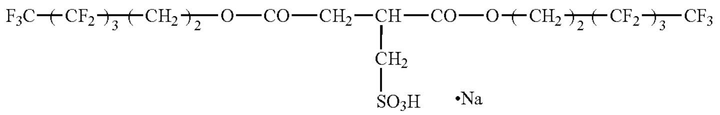
2 mg/m$^2$
SD-1
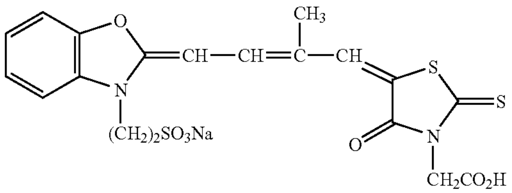
Cpd-3
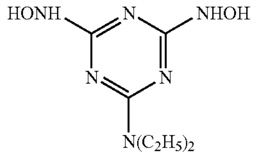
aqL-6
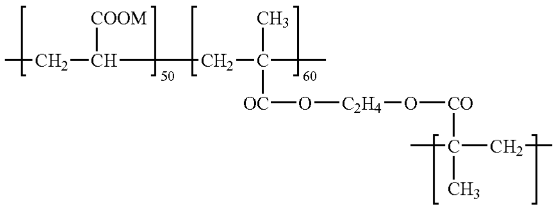
M = H or Na
Cpd-7
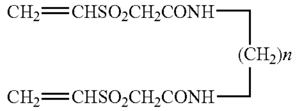
(n = 2) : (n = 3) = 3 : 1
Cpd-8
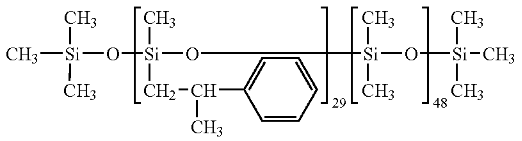
Cpd-9
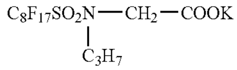
Cpd-10
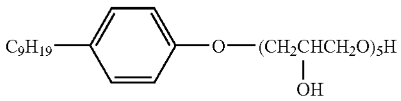
Cpd-11
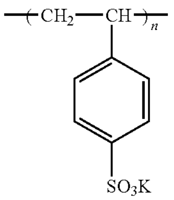
Average molecular weight = 1000000
Cpd-13
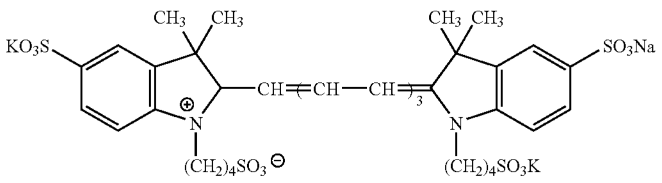
Cpd-14
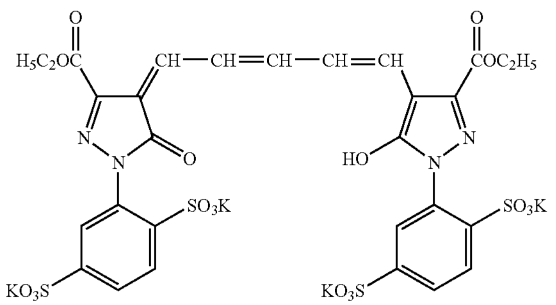
Cpd-15
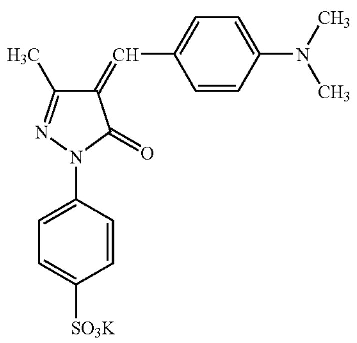

-continued

Cpd-16

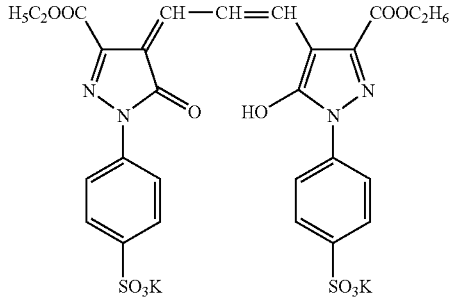

Cpd-17

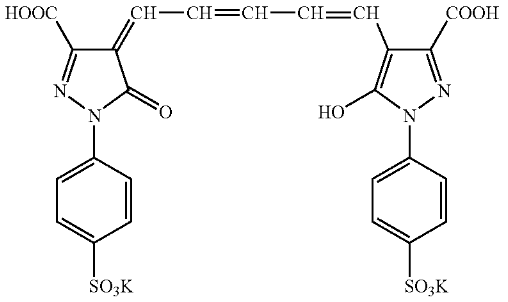

Cpd-18

$CH_3(CH_2)_{11}—CH═CHSO_2Na$

Cpd-19

$CH_3(CH_2)_{11}—CH_2═CHSO_3Na$ (Support)

On both surfaces of a biaxially stretched polyethylene terephthalate support (thickness: 100 μm), first and second undercoat layers having compositions below were coated.

(First Undercoat Layer)

| | |
|---|---|
| Core Shell type Vinylidene Chloride Copolymer (1) | 15 g |
| 2,4-dichloro-6-hydroxy-s-triazine | 0.25 g |
| Polystyrene fine particles (average particle diameter: 3 μm) | 0.05 g |
| Compound (Cpd-20) | 0.20 g |
| Colloidal silica (Snowtex ZL, average particle diameter: 70 to 100 μm, manufactured by Nissan Chemical Industries, Ltd.) | 0.12 g |

Water was added thereto to be 100 g in total.

Furthermore, a coating solution where 10% by weight of KOH was added to adjust the pH to 6 was coated so that a dry thickness may be 0.9 μm after drying at 180° C. for 2 min.

(Second Undercoat Layer)

| | |
|---|---|
| Gelatin | 1 g |
| Methyl cellulose | 0.05 g |
| Compound (Cpd-21) | 0.02 g |
| $C_{12}H_{25}O(CH_2CH_2O)_{10}H$ | 0.03 g |
| Proxel | $3.5 \times 10^{-3}$ g |
| Acetic acid | 0.2 g |

Water was added thereto to be 100 g in total.

The coating solution was coated so that a dry thickness may be 0.1 μm after drying at 170° C. for 2 min.

Core Shell Type Vinylidene Chloride Copolymer (1)

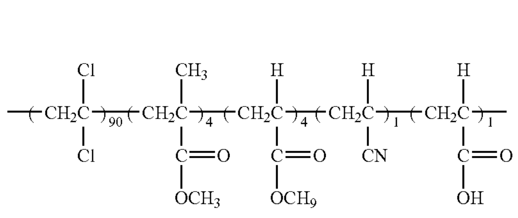

VDC MMa MA AN AA

Core: VDC/MMA/MA (80 weight percent)
Shell: VDC/AN/AA (20 weight percent)
Average particle size: 70 nm Core: VDC/MMA/MA (80 weight percent)
Shell: VDC/AN/AA (20 weight percent)
Average particle size: 70 nm Compound (Cpd - 20)

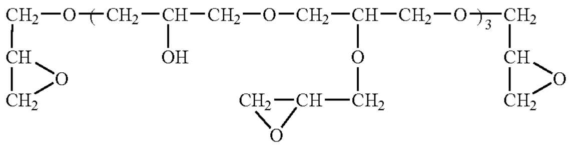

Compound (Cpd - 21)

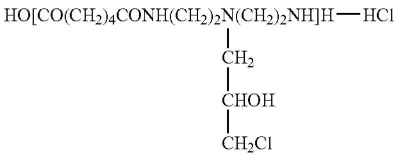

(Coating Method)

On the undercoated support, firstly, as an emulsion surface side, from a side closer to the support, in order of a UL layer and an emulsion layer, two layers were simultaneously multi-layer coated while maintaining at 35° C. according to a slide bead coater method, followed by allowing going past a cold air set zone (5° C.). Now, the foregoing amount of the Cpd-7 that is a hardener was added to the UL layer immediate before coating and allowed to diffuse from the UL layer, and thereby the Cpd-7 was contained in the emulsion layer. On a side opposite to the emulsion surface, from a side closer to the support, in order of a conductive layer and a back layer, the conductive layer and the back layer were simultaneously multi-layer coated according to a curtain coater method while adding a hardener solution, followed by allowing going past a cold air set zone (5° C.). At time points when the respective set zones were past through, the coating solutions showed sufficient setting property. Subsequently, both surfaces were simultaneously dried in a drying zone.

The obtained sample 1-1 was a photosensitive material that has, at the uppermost layer, an emulsion layer where an amount of coated silver is 7.6 g/m$^2$, a weight ratio of Ag/gelatin of the emulsion layer is 6.9, the swelling rate is 209% and a product of the weight ratio of Ag/gelatin and the swelling rate is 13.2. The swelling rate of the emulsion layer was obtained as follows. That is, a slice of a dry sample was observed with a scanning electron microscope and thereby a film thickness (a) of the dry emulsion layer was obtained, a slice of a sample that, after dipping in distilled water at 25° C. for 1 min, was freeze dried with liquid nitrogen was observed with a scanning electron microscope and thereby a film thickness (b) of the swollen emulsion layer was obtained, and the swelling rate was calculated according to an formula below.

$$\text{Swelling rate } (\%) = 100\times((b)-(a))/(a)$$

(Preparation of Samples 1-2 to 1-12)

Except that in the sample 1-1, an amount of coated silver, an amount of coated gelatin and an amount of coated (Cpd-7) were altered as shown in Table 1, similarly to the sample 1-1, samples 1-2 to 1-12 were obtained. Here, when the weight ratio of Ag/gelatin of the emulsion layer was varied, an amount of gelatin added to the emulsion layer after water washing and desalination was altered, and when an amount of the coated silver is varied, a coating amount of the emulsion layer was varied.

Thus obtained samples 1-1 to 1-12 were subjected to exposure, development and plating described below.

(Exposure and Development)

On an emulsion layer of each of the respective dry samples, a grid pattern that can form a developed silver image of line/space of 15 μm/285 μm (pitch: 300 μm) was exposed with an image setter (trade name: FT-R5055, manufactured by Dainippon Screen Mfg. Co., Ltd.). At this time, an amount of exposure was adjusted so as to be best for each of the samples.

Each of exposed samples was subjected to processes below and thereby two kinds of conductive films (conductive film a and conductive film b) were prepared for each thereof.

Conductive film a: A development process shown below was applied and thereby a conductive film of which conductive metal portion was formed of developed silver was prepared.

Conductive film b: A development process and a subsequent plating process below were applied and thereby a conductive film of which conductive metal portion was formed of developed silver and copper was prepared.

Development Process

| Processing Step | Temperature | Time |
|---|---|---|
| Monochrome development | 20° C. | 60 sec |
| Fixing | 35° C. | 40 sec |
| Rinse 1* | 35° C. | 60 sec |
| Rinse 2* | 35° C. | 60 sec |
| Drying | 50° C. | 60 sec |

Plating Process

| | | | |
|---|---|---|---|
| Acid washing | 35° C. | 30 sec | |
| Electrolytic plating 1 | 35° C. | 30 sec | Voltage 70 V |
| Electrolytic plating 2 | 35° C. | 30 sec | Voltage 20 V |
| Electrolytic plating 3 | 35° C. | 30 sec | Voltage 10 V |
| Electrolytic plating 4 | 35° C. | 30 sec | Voltage 5 V |
| Rinse 3* | 35° C. | 10 sec | |
| Rinse 4* | 35° C. | 10 sec | |
| Anti-rust solution | 35° C. | 30 sec | |
| Rinse 5* | 25° C. | 60 sec | |
| Rinse 6* | 25° C. | 60 sec | |
| Drying | 50° C. | 60 sec | |

*In a water washing process, a two-tank counter flow method from Rinse 2 to Rinse 1, from Rinse 4 to Rinse 3 and from Rinse 6 to Rinse 5 was adopted.

Compositions of the respective processing solutions are as follows.

(Monochrome Development Solution: Prescription for 1 L)

| | |
|---|---|
| Hydroquinone | 20 g |
| Sodium sulfite | 50 g |
| Potassium carbonate | 40 g |
| Ethylene diamine tetra acetic acid | 2 g |
| Potassium bromide | 3 g |
| Polyethylene glycol 2000 | 1 g |
| Potassium hydroxide | 4 g |
| pH | Adjusted to 10.3 |

(Fixing Solution: Prescription for 1 L)

| | |
|---|---|
| ATS | 1.2 mol |
| Ammonium iodide | 5 g |
| Ammonium sulfite monohydrate | 25 g |
| Acetic acid | 5 g |
| Aqueous ammonia (27%) | 1 g |
| pH | Adjusted to 6.2 |

(Acid Washing Solution: Prescription for 1 L)

| | |
|---|---|
| Sulfuric acid | 190 g |
| Hydrochloric acid (35%) | 0.06 mL |
| Copper gleam PCM (manufactured by Rohm and Haas Electronic Materials LLC) | 5 mL |
| Pure water | Added to be 1 L in total |

(Electrolytic Plating Solution: Prescription for 1 L)

Composition of electrolytic copper plating solution (A replenishment solution as well has the same composition)

| | |
|---|---|
| Copper sulfate pentahydrate | 75 g |
| Sulfuric acid | 190 g |
| Hydrochloric acid (35%) | 0.06 mL |
| Copper gleam PCM (manufactured by Rohm and Haas Electronic Materials LLC) | 5 mL |
| Pure water | Added to be 1 L in total |

| (Anti-rust Solution) | (Prescription for 1 L) |
|---|---|
| Sodium nitrate | 0.2 mol/L aqueous solution |
| (Rinse Solution: Prescription for 1 L (common for rinses 1 to 6)) | |
| Deionized water (conductivity: 5 μS/cm or less) | 1000 mL |
| PH | adjusted to 6.5 |

A redox potential of a monochrome developer was −340 mV vs SCE in terms of an immersion potential obtained by immersing a rotary platinum electrode in a developer.

Each of the samples was subjected to the exposure and development, and thereby a conductive metal film made of a metallic silver portion or a conductive metal portion and a light-transmitting portion where metal is not substantially present was formed. Here, the metallic silver portion or the conductive metal portion shows a mesh pattern corresponding to an exposure pattern, and a line and space width each was 15 μm and 285 μm for all samples. Furthermore, in all samples, an aperture ratio of a light-transmitting portion was substantially 90%.

(Evaluation 1)

Of the obtained respective conductive metal films, the surface resistivity was evaluated of the conductive metal films (a) and the plating uniformity was evaluated of the conductive metal films (b) according to methods described below.

(1) Surface Resistivity

The surface resistivity of each of the conductive metal films (a) prepared with the respective samples was measured with a low resistivity meter Rolester GP/ASP Probe (trade name, manufactured by Mitsubishi Chemical Corporation) in accordance with JIS K7194.

(2) Plating Uniformity

The plating uniformity of each of the conductive metal films (b) prepared with the respective samples was visually observed and ranked according to criterion below.

5: Highly excellent level. The plating irregularity was hardly observed.

4: Excellent level. Only slight plating irregularity was observed.

3: Permissible level. The plating irregularity was observed to an allowable level.

2: Impermissible level. The plating irregularity was obviously observed.

1: Impermissible level. The plating was only partially forwarded.

When the plating irregularity level was in the middle of the evaluation levels, an average value of concerned evaluation values was taken as an evaluation value.

(Evaluation 2)

Unexposed samples 1-1 to 1-12 were developed as they are, and surfaces of the respective samples were visually observed to evaluate whether black spot-like developed silver was formed or not. Evaluation criteria were as follows.

<Evaluation Criteria of Incidence of Black Spot (1 $m^2$ of Developed Sample was Observed)>

Level A: The number of black spots is 0 to 3.

Level B: The number of black spots is 4 to 10.

Level C: The number of black spots is 10 or more.

Obtained evaluation results are shown in Table 1.

From table 1, it is found that the higher the swelling rate of the sample is, the lower the surface resistivity at a stage before the plating is, that is, the more preferable as photosensitive material is. It is further found that the higher the swelling rate of the sample is, the more excellent in the plating uniformity after the plating is; accordingly, even when the conductive film is formed by means of the plating, the swelling rate of the photosensitive material can be advantageously heightened. Furthermore, it is found that when the swelling rates are close, the higher the weight ratio of Ag/gelatin in the emulsion layer is, the lower the surface resistance is and the more uniform the plating is, that is, the more preferable as the conductive film-forming photosensitive material.

Furthermore, the black spot formed in the evaluation (2), which is inadvertently formed, is not preferable one. As shown in Table 1, the higher the weight ratio of Ag/gelatin is, the higher the incidence of the black spot is. When the black spot portion was observed with an optical microscope, an agglomerated state of silver was observed; accordingly, it was assumed that the occurrence of the black spot is caused by the agglomeration of silver halide particles owing to deficiency of the gelatin. While a higher weight ratio of Ag/gelatin in the emulsion layer is advantageous in lowering the surface resistance value, there are concerns of agglomeration of silver halide. Since, when a swelling rate is set high like in the invention, a lower resistance value can be obtained at a lower Ag/gelatin ratio, it is very effective to the above concerns.

Example 2

Preparation of Samples 2-1 to 2-4

Except that, in the sample 1-1 according to the example 1, to the emulsion layer, 90 mg/$m^2$ of 2,4-dichloro-6-hydroxy-1,3,5-triazine sodium salt was added, and, to the gelatin, 15% by weight of colloidal silica having a particle diameter of 10 μm, 100 mg/$m^2$ of aqueous latex (aqL-6), 150 mg/$m^2$ of polyethyl acrylate latex, 150 mg/$m^2$ of a latex copolymer of methyl acrylate, 2-acrylamide-2-methyl propane sulfonate sodium salt and 2-acetoxyethyl methacrylate (weight ratio 88:5:7) and 150 mg/$m^2$ of core-shell type latex (core: styrene/butadiene copolymer (weight ratio 37/63), shell: styrene/2-acetoxyethyl acrylate (weight ratio 84/16), and core/shell ratio=50/50) were added, utterly similarly to the sample 1-1, a sample 2-1 was obtained.

TABLE 1

| Sample No. | Silver amount in emulsion layer (g/$m^2$) | Gelatin amount in emulsion layer (g/$m^2$) | Weight ratio of Ag/gelatin | Cpd-7 coating amount (mg/$m^2$) | Swelling rate of emulsion layer (%) | 1) | 2) | 3) | Relationship with the invention |
|---|---|---|---|---|---|---|---|---|---|
| 1-1 | 7.6 | 1.10 | 6.9 | 40 | 209 | 34 | 4.0 | B | Present invention |
| 1-2 | 7.6 | 1.10 | 6.9 | 60 | 181 | 60 | 3.0 | B | Present invention |
| 1-3 | 7.6 | 1.10 | 6.9 | 80 | 142 | 210 | 2.0 | B | Comparative example |
| 1-4 | 7.6 | 1.10 | 6.9 | 20 | 281 | 24 | 4.5 | B | Present invention |
| 1-5 | 7.6 | 1.30 | 5.8 | 20 | 298 | 60 | 3.0 | A | Present invention |
| 1-6 | 7.6 | 1.30 | 5.8 | 40 | 220 | 75 | 3.0 | A | Present invention |
| 1-7 | 7.6 | 1.30 | 5.8 | 60 | 189 | 125 | 3.0 | A | Present invention |
| 1-8 | 7.6 | 1.30 | 5.8 | 80 | 146 | 380 | 3.0 | A | Comparative example |
| 1-9 | 7.6 | 0.90 | 8.4 | 20 | 260 | 18 | 5.0 | C | Present invention |
| 1-10 | 7.6 | 0.90 | 8.4 | 40 | 197 | 29 | 3.5 | C | Present invention |
| 1-11 | 7.6 | 0.90 | 8.4 | 60 | 171 | 48 | 3.5 | C | Present invention |
| 1-12 | 7.6 | 0.90 | 8.4 | 80 | 137 | 160 | 3.5 | C | Comparative example |

1) Surface resistance of conductive film (a) (Ω/□)

2) Plating uniformity of conductive film (b)

3) Black spot level

In the sample 2-1, only an amount of coated silver, an amount of coated gelatin and an amount of coated (Cpd-7) were altered as shown in Table 2 and thereby samples 2-2 to 2-4 were obtained. Here, when the weight ratio of Ag/gelatin in the emulsion layer was varied, an amount of gelatin added to the emulsion layer after water washing and desalination was altered, and when an amount of the coated silver is varied, a coating amount of the emulsion layer was varied.

To the obtained respective samples, similarly to example 1, exposure., development and plating were applied, followed by evaluating the surface resistivity before the plating and the plating uniformity after the plating. Results are shown in Table 2.

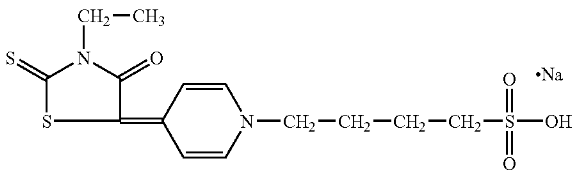

TABLE 2

| Sample No. | Silver amount in emulsion layer ($g/m^2$) | Gelatin amount in emulsion layer ($g/m^2$) | Weight ratio of Ag/gelatin | Cpd-7 coating amount ($mg/m^2$) | Swelling rate of emulsion layer | 1) | 2) | Relationship with the invention |
|---|---|---|---|---|---|---|---|---|
| 2-1 | 7.6 | 1.10 | 6.9 | 40 | 184 | 61 | 3.5 | Present invention |
| 2-2 | 7.6 | 1.10 | 6.9 | 60 | 163 | 82 | 3.0 | Present invention |
| 2-3 | 7.6 | 1.10 | 6.9 | 80 | 135 | 243 | 2.0 | Comparative example |
| 2-4 | 7.6 | 1.10 | 6.9 | 20 | 237 | 30 | 4.0 | Present invention |

1) Surface resistance of conductive film (a) (Ω/□)
2) Plating uniformity of conductive film (b)

From Table 2, it is obvious that even in the photosensitive materials where the compounds were added to the emulsion layers as mentioned above the invention is effective.

Example 3

Except that, in the samples 1-1 to 1-4 prepared in the example 1, a spectral sensitizing dye SD-1 was altered to a spectral sensitizing dye SD-2, the Cpd-14 was altered to Cpd-YF below, and a back layer was not coated, similarly to the samples 1-1 to 1-4, samples 3-1 to 3-4 were prepared. Furthermore, except that in the samples 2-1 to 2-4 prepared in the example 2, the spectral sensitizing dye SD-1 was altered to the spectral sensitizing dye SD-2, the Cpd-14 was altered to Cpd-YF below, and a back layer was not coated, similarly to the samples 2-1 to 2-4, samples 3-5 to 3-8 were prepared. Coating amounts of the SD-2 and Cpd-YF were set to amounts (mole $m^2$) same as that of SD-1 and Cpd-14.

The obtained samples were subjected to exposure by use of a contact printer with a high-pressure mercury lamp as a light source through a mesh-like photomask having a fine line width of 10 μm and a grid separation of 300 μm, followed by applying a development process and a plating process similarly to example 1, further followed by evaluating the surface resistance of the developed silver and the plating uniformity.

When the evaluation was carried out similarly to the example 1, in samples 3-1,2,4 to 6 and 8, excellent advantages according to the invention were confirmed. Furthermore, after samples 3-1 to 3-8 were exposed over an entire surface thereof by use of a contact printer with a high-pressure mercury lamp as a light source, the development and plating were similarly applied, followed by evaluating, and thereby a result that the higher the swelling rate is, the lower the surface resistivity and the more uniform the plating are was obtained. It was shown that advantages of the invention could be obtained irrespective of an exposure pattern.

-continued (SD-2)

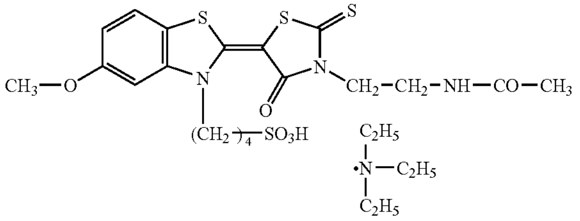

Mixture of molar ratio of 1:2

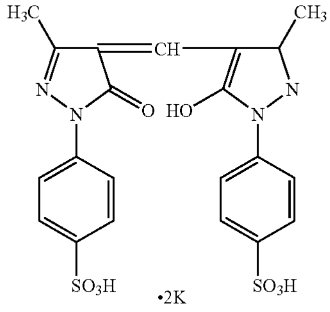

Cpd-YF

Example 4

A mesh pattern with a line width of 15 μm and a pitch of 300 μm was exposed to samples 3-1, 3-2, 3-5 and 3-6 prepared in Example 3 by use of an image setter (trade name: Cobalt 8, manufactured by ESCHER-GRAD Co., Ltd., a laser wavelength: 410 nm) with a blue ray semiconductor laser. The respective exposed samples were subjected to the development and plating similarly to example 1.

The electromagnetic wave shielding capability of each of the plated samples was investigated according to an Advantest method and it was confirmed that all samples had the shielding capability of 30 dB or more in the range of 30 MHz to 1 GHz and the photosensitive material according to the invention was effective in the manufacture of the conductive metal film having the electromagnetic wave shielding property. Furthermore, it was also confirmed that all samples had an aperture ratio of 85% or more and the photosensitive material according to the invention was effective in the manufacture of the light-transmitting film shielding electromagnetic wave for plasma display panels and so on.

Example 5

Except that an upper protective layer and a lower protective layer described below were coated outside of the emulsion layer, similarly to sample 3-1 prepared in example 3, sample 5-1 was prepared. An entire exposure and a development similar to example 3 were applied to samples 3-1 and 5-1 and thereby conductive films of which metal portion was formed of developed silver were prepared. The obtained conductive films were investigated similarly to example 4 of the electromagnetic wave shielding capability and found for both to exhibit preferable electromagnetic wave shielding capability. It was shown that the invention was advantageous even when the protective layer was disposed outside of the emulsion layer.

(Upper Protective Layer)

| | |
|---|---|
| Gelatin | 0.3 $g/m^2$ |
| Amorphous silica matting agent having an average particle diameter of 3.5 μm | 25 $mg/m^2$ |
| Compound (Cpd-8) (gelatin dispersion) | 20 $mg/m^2$ |
| Colloidal silica having a particle diameter in the range of 10 to 20 μm (trade name: Snowtex C, manufactured by Nissan Chemical Industries. Ltd.) | 30 $mg/m^2$ |
| Compound (Cpd-9) | 50 $mg/m^2$ |
| Sodium dodecylbenzene sulfonate | 20 $mg/m^2$ |
| Compound (Cpd-10) | 20 $mg/m^2$ |
| Compound (Cpd-11) | 20 $mg/m^2$ |
| Antiseptic (Proxel (trade name, manufactured by ICI Co., Ltd.)) | 1 $mg/m^2$ |

(Lower Protective Layer)

| | |
|---|---|
| Gelatin | 0.5 $g/m^2$ |
| 1,5-dihydroxy-2-benzaldoxime | 10 $mg/m^2$ |
| Polyethyl acrylate latex | 150 $mg/m^2$ |
| Compound (Cpd-13) | 3 $mg/m^2$ |
| Antiseptic (Proxel) | 1.5 $mg/m^2$ |

Example 6

The plated conductive metal film prepared according to example was further processed with a copper blackening solution to blacken a copper surface. The blackening solution used was commercially available Copper Black (trade name, manufactured by Isotope Chemistry Laboratory).

On a PET surface side, a protective film (trade name HT-25, manufactured by Panac Ltd.) having a total thickness of 28 μm was laminated with a laminator roller. On the conductive metal portion side as well, a protective film (trade name: Sunnytect Y-26F, manufactured by Sun A Kaken Co., Ltd.) having a total thickness of 65 μm, in which an acrylic adhesive layer is layered on a polyethylene film, was laminated with a laminator roller.

In the next place, with a PET surface as an adhering surface, the PET surface was adhered through a transparent acrylic adhesive to a glass plate having a thickness of 2.5 mm and an external dimension of 950 mm×550 mm.

Subsequently, on the conductive metal portion inside thereof excluding a exterior edge having width of 20 mm, through an acrylic light-transmitting adhesive having a thickness of 25 μm, a near-infrared absorption film with an anti-reflection function, which is made of a PET film having a thickness of 100 μm, an anti-reflection layer and a near-infrared absorber-containing layer (trade name: Clearas AR/NIR, manufactured by Sumitomo Osaka Cement Co., Ltd.) was adhered. In the acrylic light-transmitting adhesive layer, a color adjusting dye (trade name: PS-Red-G and PS-Violet-Rc, manufactured by Mitsui Chemicals, Inc.) for adjusting the transmission characteristics was introduced.

Furthermore, on a surface on an opposite side of the glass plate, an anti-reflection film (trade name: Realook 8201, manufactured by Nippon Oil and Fats Co., Ltd.) was laminated through an adhesive, and thereby a light-transmitting film shielding electromagnetic wave for displays was prepared.

In the obtained light-transmitting film shielding electromagnetic wave for displays, the conductive metal portion was blackened and a display image did not show a metal color. Furthermore, owing to the use of the protective film, flaws and defects in the metal mesh were very less.

Still furthermore, the light-transmitting film shielding electromagnetic wave for displays has the electromagnetic wave shielding capability and the near-infrared cutting ability (the transmittance in 300 to 800 nm is 15% or less), which do not cause a practical problem, and was excellent in the visibility owing to the antireflection layers on both surfaces thereof. Furthermore, it was confirmed that when a dye was introduced, a color adjustment function could be imparted, and thereby the light-transmitting film shielding electromagnetic wave could be suitably used for plasma displays and so on.

The present application claims foreign priority based on Japanese Patent Application (No. JP2005-156146) filed May 27 of 2005, and the contents thereof are incorporated herein by reference.

The invention claimed is:

1. A photosensitive material comprising: a support; and an emulsion layer containing a silver salt emulsion, the photosensitive material being capable of forming a conductive metal film by exposing and developing the emulsion layer, wherein the emulsion layer has a swelling rate of 150% or more.

2. A photosensitive material comprising: a support; and an emulsion layer containing a silver salt emulsion, the photosensitive material being capable of forming a conductive metal film by exposing, developing the emulsion layer, and subjecting the emulsion layer to at least one of a physical development process and plating process, wherein the emulsion layer has a swelling rate of 150% or more.

3. The photosensitive material according to claim 1, wherein the emulsion layer has a weight ratio of silver to gelatin of 4 or more.

4. The photosensitive material according to claim 1, wherein the emulsion layer has the weight ratio of silver to gelatin of from 6 to 10.

5. The photosensitive material according to claim 1, wherein the emulsion layer has an amount of silver of 5 $g/m^2$ or more.

6. The photosensitive material according to claim 1, wherein the emulsion layer has the swelling rate of 250% or more.

7. The photosensitive material according to claim 1, wherein the emulsion layer is disposed at a substantially upper-most layer of the photosensitive material.

8. A method of manufacturing a conductive metal film, comprising:

exposing a photosensitive material described in claim 1 with light; and developing the photosensitive material.

9. A method of manufacturing a conductive metal film, comprising:

exposing the photosensitive material described in claim 1 with light;

developing the photosensitive material; and subjecting the photosensitive material to at least one of physical development process and plating process.

10. The method of manufacturing a conductive metal film according to claim 8, wherein the exposing is performed by exposing partially the photosensitive material with light to form an exposure pattern including a metallic silver portion, and the exposure pattern corresponds to an electrically conductive metal pattern.

11. The method of manufacturing a conductive metal film according to claim 10, wherein a metallic silver portion is provided in only a portion of the photosensitive material exposed with the light.

12. A conductive metal film manufactured according to a method described in claim 8.

13. The conductive metal film according to claim 12, comprising:

a conductive metal portion; and a portion having light transmissive other than the conductive metal portion.

14. A light-transmitting film shielding electromagnetic wave for a plasma display comprising a conductive metal film according to claim 13.

15. The photosensitive material according to claim 2, wherein the emulsion layer has a weight ratio of silver to gelatin of 4 or more.

16. The method of manufacturing a conductive metal film according to claim 8, wherein the emulsion layer of the photosensitive material has a weight ratio of silver to gelatin of 4 or more.

17. The method of manufacturing a conductive metal film according to claim 9, wherein the emulsion layer of the photosensitive material has a weight ratio of silver to gelatin of 4 or more.

18. The photosensitive material according to claim 2, wherein the emulsion layer has an amount of silver of 5 $g/m^2$ or more.

19. The method of manufacturing a conductive metal film according to claim 8, wherein the emulsion layer of the photosensitive material has an amount of silver of 5 $g/m^2$ or more.

20. The method of manufacturing a conductive metal film according to claim 9, wherein the emulsion layer of the photosensitive material has an amount of silver of 5 $g/m^2$ or more.

* * * * *